(12) United States Patent
Jung et al.

(10) Patent No.: US 6,325,676 B1
(45) Date of Patent: Dec. 4, 2001

(54) GAS ETCHANT COMPOSITION AND METHOD FOR SIMULTANEOUSLY ETCHING SILICON OXIDE AND POLYSILICON, AND METHOD FOR MANUFACTURING SEMICONDUCTOR DEVICE USING THE SAME

(75) Inventors: Kwang Jin Jung, Suwon; Il Jeong Park, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/534,971

(22) Filed: Mar. 27, 2000

(30) Foreign Application Priority Data

Sep. 28, 1999 (KR) .................................................. 99-41463

(51) Int. Cl.[7] .................................................. H01L 21/00

(52) U.S. Cl. .............................. 439/719; 216/67; 216/79; 252/79.1; 438/723; 438/737; 438/738; 438/743

(58) Field of Search .................................... 438/710, 712, 438/719, 723, 737, 738, 740, 743; 216/67, 79; 252/79.1

(56) References Cited

U.S. PATENT DOCUMENTS

| | | | | |
|---|---|---|---|---|
| 3,880,684 | * | 4/1975 | Abe | .................................. 438/723 X |
| 4,431,477 | * | 2/1984 | Zajac | ...................................... 438/719 |
| 5,176,790 | * | 1/1993 | Arleo et al. | ....................... 438/723 X |
| 5,228,950 | | 7/1993 | Webb et al. . | |
| 5,721,153 | | 2/1998 | Kim et al. . | |
| 5,759,894 | | 6/1998 | Tseng et al. . | |
| 5,817,555 | | 10/1998 | Cho . | |

* cited by examiner

Primary Examiner—William A. Powell
(74) Attorney, Agent, or Firm—Volentine Francos, PLLC

(57) ABSTRACT

A gas etchant composition and a method for simultaneously etching-back silicon oxide and polysilicon at substantially similar etching rates are used for manufacturing semiconductor devices. The gas etchant composition to be utilized for dry-etching includes carbon tetrafluoride gas and nitrogen gas mixed at a ratio of 25–40:1, while its etching rate ratio of polysilicon to silicon oxide is 0.8–1.2:1. Since polysilicon and silicon oxide are simultaneously etched by a single etching equipment utilizing the gas etchant composition in a single process, a composite layer having both polysilicon and silicon oxide can be effectively removed to obtain a resulting surface having a good profile. As a result, the formation of a polysilicon bridge caused by detachments of polysilicon particles in subsequent manufacturing processes can be prevented.

16 Claims, 34 Drawing Sheets

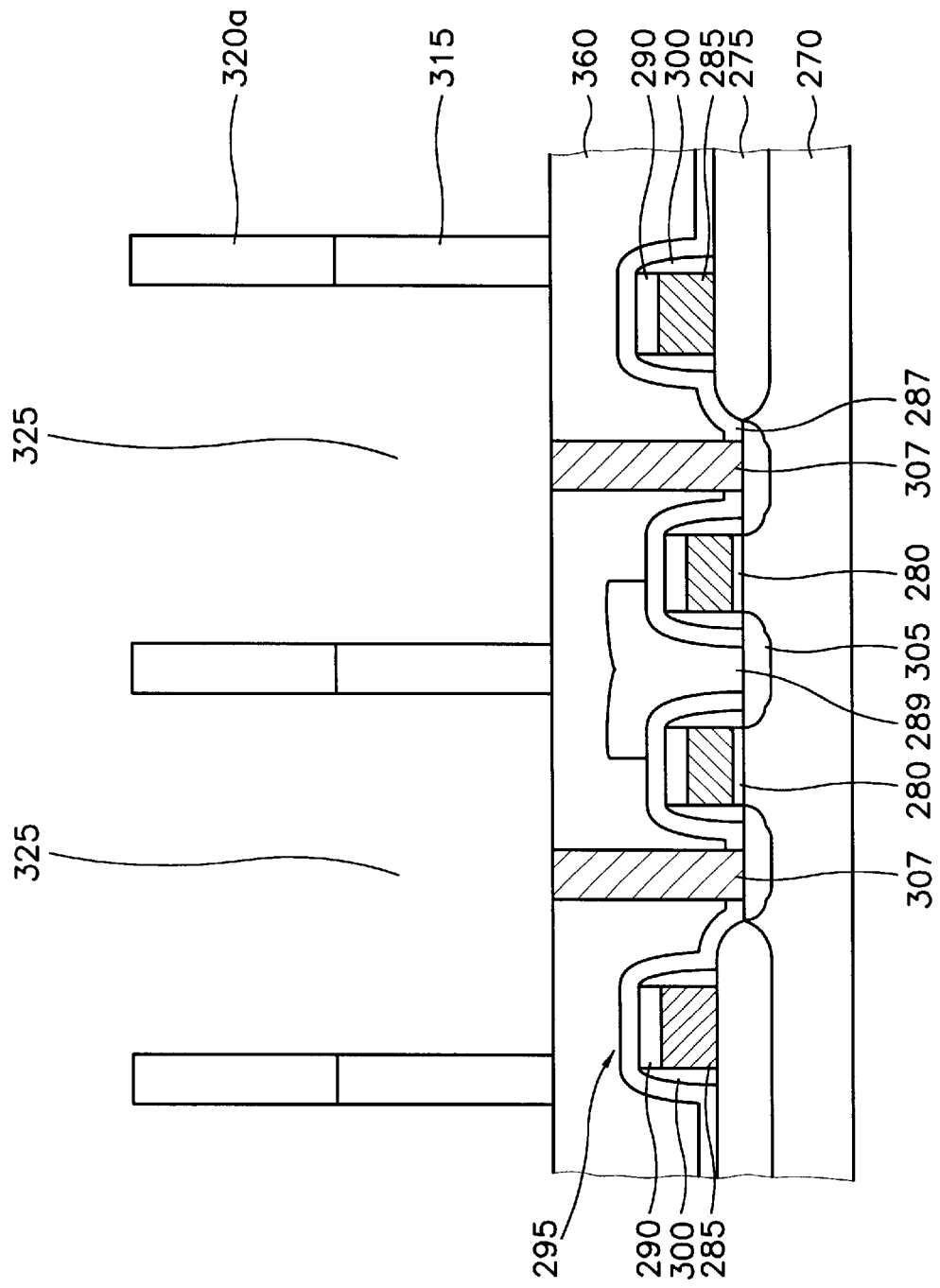

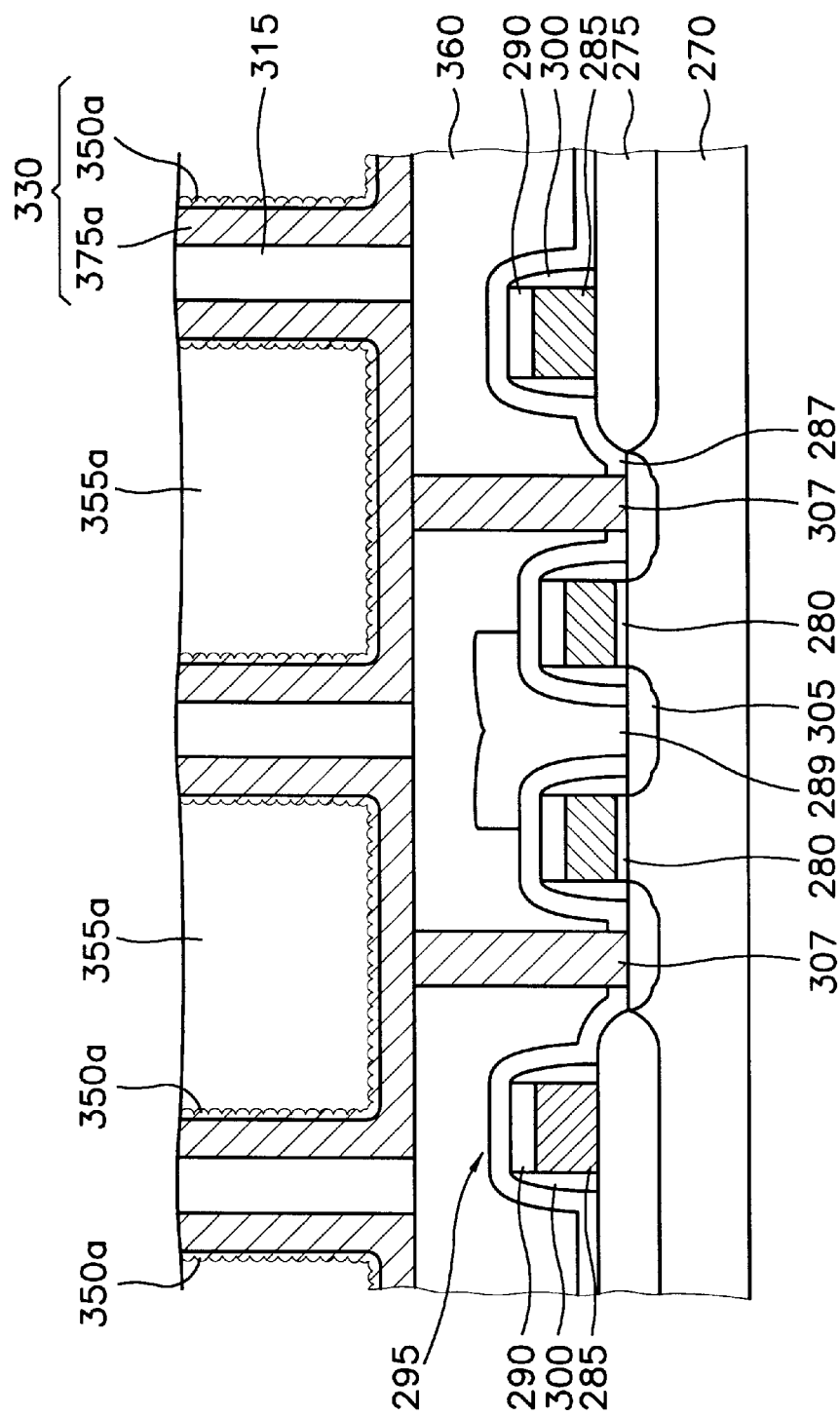

GAS ETCHANT COMPOSITION AND METHOD FOR SIMULTANEOUSLY ETCHING SILICON OXIDE AND POLYSILICON, AND METHOD FOR MANUFACTURING SEMICONDUCTOR DEVICE USING THE SAME

BACKGROUND OF THE INVENTION

1. Field of the Invention

The present invention relates to a gas etchant composition and a method for simultaneously etching silicon oxide and polysilicon, and a method for manufacturing semiconductor devices using the same. More particularly, the present invention relates to a gas etchant composition for simultaneously etching silicon oxide and polysilicon during an etch-back process of manufacturing a capacitor for a semiconductor memory device, an etching method thereof, and a method for manufacturing a semiconductor device using the same.

2. Background of the Related Art

Currently, due to widespread usage of computers in information media, memory devices are being developed which provide semiconductor devices with higher memory storage capacity and faster operating speeds. To this end, the current technology in the art is focused on developing and realizing memory devices having a high degree of integration, response speed, and reliability. Conventionally, dynamic random access memory (DRAM) devices, which have a high memory capacity and random open input/output functions, are widely used as semiconductor memory devices.

DRAM devices generally comprise a memory cell having at least one transistor and a capacitor to charge/discharge electrical charges for input/output functioning of information data. Further, DRAM devices conventionally comprise a memory cell region for storing large information data and peripheral circuits for input/out functioning of information data. To obtain a high integration in such DRAM devices comprising a capacitor, it is necessary to decrease the size of the cells, which results in decreased sizes and degree of margins of patterns formed on a semiconductor substrate. Consequently, the aspect ratio of the components which make up the substrate increases.

Conventionally, a stacked-capacitor cell having an electrode comprising polysilicon layers and a dielectric film made from a silicon nitride layer is widely used as a DRAM cell for Mb DRAMs. However, it is difficult to obtain an adequate cell capacitance with the capacitor cell having such a simple stacked structure in highly integrated DRAMs. As such, tantalum oxide layers having a higher dielectric constant are utilized for the dielectric layers in place of silicon nitride layers, or the structure of the stacked-capacitors is changed to increase the effective area of the capacitors.

Generally, to increase the cell capacitance in DRAMs, the storage electrode is heightened to form a stacked-structure. However, in view of the very high integration of semiconductor devices, the size of the cells need to be decreased instead. Thus, in order to increase the cell capacitance, the critical distance between storage electrodes formed on the cells should be decreased or the height of the storage electrode should be increased. However, if the critical distance is decreased, an electrical bridge may form between adjacent storage electrodes, thereby causing a short. If the height of the storage electrode is increased the global step in the devices is also increased, which leads to decreased image margin during the photo-process, thereby causing shorts between the metal wirings in the subsequent processes.

To increase the effective area of the capacitors, a method of forming a rugged shape on the surface of polysilicon layers used for obtaining the storage electrode of capacitors has been suggested. The rugged shape is obtained by an etching process or by manipulating the manufacturing variables which control the process of growing polysilicon layers. A method of manufacturing a capacitor utilizing the above method of forming a rugged shape on the surface of polysilicon layers is described below.

First, a main storage electrode is formed at the surface of a semiconductor substrate, then a hemispherical grained (HSG) polysilicon layer is formed on the whole surface of the storage electrode, followed by an anisotropic etching process, which results in a rugged shaped storage electrode.

The above HSG polysilicon layer is formed on the surface of the main storage electrode by using helium diluted $SiH_4$ gas under a pressure of 1.0 Torr and at a temperature of 550° C. By utilizing such an HSG polysilicon layer, the cell capacitance can be significantly increased, since the effective area can be increased two to three times over the conventional polysilicon layer not having the rugged shape structure.

As shown by the above, the current technology of increasing the cell capacitance of DRAMs utilizes the method of manufacturing a capacitor having a stacked structure and forming an HSG silicon layer for increasing the effective area. Specifically, for 256 Mb DRAMs, a storage electrode having a one cylinder stacked structure is being widely used. Such a method is disclosed in U.S. Pat. Nos. 5,721,153, 5,817,555 and 5,759,894.

For manufacturing the above stacked-capacitors, a selective etching process for etching a structure of both silicon oxide and polysilicon material must be used. Conventionally, for selectively etching polysilicon in a composite layer having both polysilicon and silicon oxide, a mixed composition of carbon tetrachloride gas and argon gas, a mixed gas of $CF_4$ and oxygen, $CF_3Cl$ gas, and a mixed composition of fluoro-carbon type compound and chloride gas are utilized. On the other hand, carbon tetrafluoride gas, $C_2F_4$ gas, and $CHF_3$ gas are utilized for selectively etching silicon oxide.

However, distinct homogeneous layers of silicon oxide or polysilicon can be etched simultaneously. For example, U.S. Pat. No. 5,228,950 discloses a method of removing residues from oxide and silicon materials by using an etchant gas comprising $NF_3$ as a main constituent.

Accordingly, in the conventional etching process, an etchant and etching equipment are selected based upon the type of material to be etched, such as polysilicon, oxide or metals. Preferably, for selectively etching layers near or adjacent to layers not to be etched, an etchant having a high selectivity for the layer to be etched is selected. In this respect, gate electrodes and bit-lines, which conventionally comprise polysilicon, are etched by utilizing polysilicon etching equipment, while silicon oxide etching equipment is used for etching insulating layers of hot temperature oxide (HTO) and BPSG, which conventionally comprise silicon oxide.

However, recently, as semiconductor devices become more highly integrated, the conventional etching process described above is becoming inadequate for more complicated processes. Particularly, in the process of manufacturing semiconductor devices, a composite layer comprised of a number of different materials such as polysilicon and silicon oxide is currently used in various components as opposed to a conventional single layer structure.

Accordingly, the semiconductor manufacturing industry has been attempting to find a method of effectively etching composite layers comprising both polysilicon and silicon oxide.

FIGS. 1A to 1J are sectional views illustrating a manufacturing process of a conventional semiconductor device comprising a capacitor having a cylindrical shape.

Referring to FIG. 1A, on a semiconductor substrate 70 made from a semiconductor material such as silicon, a field oxide layer 75 for defining the active regions of various devices on the substrate 70 is formed by a local oxidation of silicon (LOCUS) method. On the active region defined by the field oxide layer 75, a gate oxide layer 80 is formed by thermal oxidation.

A first polysilicon layer and subsequently a first insulating layer made from silicon oxide are then formed on the surface of the substrate 70. The first polysilicon layer and first insulating layer are then etched to obtain gate electrodes 95 each having a polysilicon pattern 85 and an insulating layer pattern 90 on its respective gate oxide layer 80 or field oxide layer 75. Thereafter, utilizing the gate electrode 95 as an ion implantation mask, a low concentration impurity region on the semiconductor substrate 70 is formed by ion implanting a low concentration of impurity.

Then, a second insulating layer is formed on the substrate 70 by a low pressure chemical vapor deposition method or a plasma enhanced chemical vapor deposition method utilizing high temperature oxide (HTO) or the like oxide material. The deposited second insulating layer is then etched by an anisotropic etching method to form a spacer 100 on the respective side walls of the gate electrodes 95.

Thereafter, utilizing the gate electrode 95 and the spacer 100 as an ion implantation mask, a transistor source/drain region 105 having a lightly doped drain (LLD) structure is formed by ion implanting a high concentration of impurity on the active region.

An insulating interlayer 87 comprising silicon oxide is then formed on the surface of the substrate 70 having gate electrode 95, followed by forming a hole in the insulating interlayer 87 to expose a portion of the common source/drain region 105 by a conventional photolithography process. Then, a metal layer filling the above hole is deposited on the surface of the insulating interlayer 87 by a sputtering method using aluminum or like metals, and a bit-line 89 as shown is formed by patterning the metal layer.

Then, a second insulating interlayer 160 comprising BPSG or PSG is formed by a low pressure chemical vapor deposition method or a plasma enhanced chemical deposition method. The surface of the second insulating interlayer 160 is planarized by a chemical mechanical polishing (CMP) method, in preparation for subsequent deposition and patterning processes.

Referring to FIG. 1B, a contact hole 107 for exposing a portion of the source/drain region 105 is formed by subjecting the first and second insulating interlayers 87 and 160 to a conventional photolithography process. The contact hole 107 is then filled to form a first conductive layer 165 on the surface of the second insulating interlayer 160. The first conductive layer 165 is formed by depositing a doped polysilicon using a low pressure chemical vapor deposition method.

Referring to FIG. 1C, the above first conductive layer 165 is then subjected to a CMP process or an etch-back process to form a contact 170 in the contact hole 107 communicating with the source/drain region 105.

Referring to FIG. 1D, on the common surface of the contact 170 and the second insulating interlayer 160, a sacrificial layer 115 comprising BPSG, PSG, USG, or the like oxide material is formed, followed by forming a photoresist film 120 on the surface of the sacrificial layer 115.

Referring to FIG. 1E, the photoresist film 120 formed on the surface of the sacrificial layer 115 is then subjected to a photo-process to form a photoresist pattern 120a, and using the photoresist pattern 120a as a mask, the sacrificial layer 115 is etched to form holes 125 for exposing the contact 170 and the second insulating interlayer 160 in their respective cell units.

Referring to FIG. 1F, after removing the photoresist pattern 120a, a continuous layer of second conductive layer 175 is formed on the surfaces of the contact 170 and second insulating interlayer 160 exposed by the hole 125 and on the sidewalls and the upper surface of the sacrificial layer 115. The second conductive layer 175 is formed by depositing impurity-doped polysilicon using a low pressure chemical vapor deposition method. As a result, the cells are formed with a well or a groove covered with a second conductive layer 175 made from polysilicon. Thereafter, an HSG silicon layer 150 is formed on the surface of second conductive layer 175 which is now formed on the sacrificial layer 115 and source/drain region 105. The HSG silicon layer is formed on the inner and bottom surfaces of the well of the second conductive layer 175 by a reduced pressure chemical vapor deposition method.

Referring to FIG. 1G, on the second conductive layer 175 now being covered with HSG silicon layer 150, a protective layer 155 is formed by a reduced pressure chemical deposition method utilizing undoped silicate glass (USG) having silicon oxide as its main constituent. The protective layer 155 which fills the well defined by the second conductive layer 175 is formed evenly, and serves to protect the HSG silicon layer 150 formed on the second conductive layer 175 during the subsequent etching process of forming storage electrodes.

Referring to FIG. 1H, the protective layer 155 is subjected to an etch-back process to leave behind a protective layer residue 155a, while exposing the remaining HSG silicon layer 150 and the second conductive layer 175 formed on the sacrificial layer 115. Here, oxide material-etching equipment and a dry-etching method utilizing plasma are used for the etch-back process, and the etching gas composition is adjusted to have a higher selectivity for the protective layer 155 comprising silicon oxide material and to have less selectivity for the HSG silicon layer 150 and the second conductive layer 175, both comprising polysilicon material. Appropriately, a gas etchant having $C_2F_4$ gas, $CHF_3$ gas, or $CF_4$ gas as its main composition are utilized to have a higher selectivity for the protective layer 155 formed from silicon oxide material. Because the etch-back process is more active at the middle regions, the center portion of the well shows more etching in contrast to the peripheral region, leaving behind the protective layer residue 155a having a recessed center portion.

Referring to FIG. 1I, the semiconductor substrate 70 is then transferred to another etching equipment for etching the HSG silicon layer 150 and the second conductive layer 175 formed on the surface of the sacrificial layer 115, until the upper portion of the sacrificial layer 115 is exposed. Here, the etching is performed by polysilicon-etching equipment via a dry-etching method utilizing plasma, and the gas etchant is adjusted to have a higher selectivity for the HSG silicon layer 150 and the second conductive layer 175 both comprising polysilicon material, and to have a lower selectivity for the protective layer residue 155a and the sacrificial layer 115 both comprising silicon oxide material. For example, by utilizing a dry etchant composition mainly comprising chlorine gas which has a higher selectivity for polysilicon material, the HSG silicon layer 150 and the second conductive layer 175 can be selectively etched away. A cylindrical-shaped storage electrode 130 is formed on each unit cell, the storage electrodes 130 comprising a second conductive layer pattern 175a and an HSG silicon layer pattern 150a. Here, during the etching process of etching the second conductive layer 175 and the HSG silicon layer 150, the protective layer residue 155a is also partially etched simultaneously.

In the above etching process, after etching the horizontal portion of the second conductive layer 175, the vertical portion is also subsequently etched. As shown in FIG. 1I, the vertical etching is more active at the center portion than the peripheral region, causing the second conductive layer 175 to have a profile with a depressed center. Referring to FIG. 1J, by utilizing an etchant composition to completely remove all silicon oxide remaining on the semiconductor substrate 70, the sacrificial layer 115 and the protective layer residue 155a remaining in the well of the storage electrode 130 are removed by a wet-etching process. Then, on the surface of the storage electrode 130, a dielectric film 135 and subsequently a plate electrode 140 are formed to obtain a capacitor 145. Thereafter, a DRAM device is formed with a transistor and the capacitor 145 by the conventional semiconductor device manufacturing processes.

According to the above described process of manufacturing a semiconductor memory device, in the process of forming a storage electrode, the second conductive layer 175, which is covered with HSG silicon layer 150, and the protective layer 155 both comprise polysilicon material and are subjected to an etch-back process by utilizing two separate pieces of etching equipment (a silicon oxide-etching device and a polysilicon-etching device) using respective gas etchants.

Utilizing two such separate etching steps for the etch-back process renders an unsatisfactory surface profile. Specifically, when the protective layer 155 is etched first utilizing silicon oxide-etching equipment, the polysilicon-constituted second conductive layer 175 and HSG silicon layer are exposed while the protective layer 155 is being etched. In this state, because the etching process is more selective for the silicon oxide-constituted protective layer 155, the second conductive layer 175 and the HSG silicon layer 150 are etched less, resulting in an upward protrusion profile as shown by FIG. 1H. Further, in the subsequent process of selectively etching the second conductive layer 175 and the HSG silicon layer using polysilicon-etching equipment, because the polysilicon-constituted layers are etched more, the layers comprised of silicon oxide material and their neighboring portions protrude upward while the center portions of the polysilicon constituted layers show a profile having a depression.

FIG. 3A is an enlarged view of the area shown in the circle 3A of FIG. 1I, and FIG. 3B is a sectional view illustrating the area of FIG. 3A after a process of wet-etching the sacrificial layer 115. Conventionally, the semiconductor substrates having the same or similar profile as the substrate 70 shown by FIG. 1I are later subjected to a wet-etching process to remove the sacrificial layer 115 and the protective layer residue 155a shown in FIG. 3A. In such a wet-etching process, shown by FIG. 3B, an HSG polysilicon particle H which occupies the uppermost portion of the HSG silicon layer as shown by FIG. 3A commonly detaches or falls off to form an electrical polysilicon bridge with the devices from the adjacent or neighboring capacitors, causing shorts and consequently lowering the yield of the semiconductor devices.

Such a polysilicon bridge may also be caused by a second conductive layer formed on the edge portion of the semiconductor substrates, and conventionally, an additional photolithography process is applied to remove the polysilicon formed on the edge of the semiconductor substrates.

FIGS. 2A to 2F are sectional views illustrating an additional photolithography process for processing the edge portion of the semiconductor substrate illustrated in FIGS. 1D to 1I.

Referring to FIG. 2A, after forming a sacrificial layer 115 comprising a silicon oxide material, a photoresist film 120 is formed as shown by FIG. 1D.

Referring to FIG. 2B, the photoresist film 120 is subjected to a conventional photo-process to form photoresist patterns 120a and 120b for forming a hole in each unit cell. Here, the photoresist pattern 120b which is formed to mainly occupy the edge portion of the semiconductor substrate is much larger in size than the photoresist pattern 120a formed on the region of the cells. Then, by utilizing the photoresist patterns 120a and 120b as an etching mask, the sacrificial layer 115 is etched to form a number of holes 125 to be utilized for eventually forming a capacitor. Here, by the photoresist pattern 120b occupying the edge portion, a sacrificial layer pattern 115a is formed on the edge portion of the semiconductor substrate.

Referring to FIG. 2C, after removing the photoresist patterns 120a and 120b by utilizing a stripping or ashing process, a second conductive layer 175 is formed on the common surface of the contact 170 and the second insulating interlayer 160 and on the whole surface of the sacrificial layer 115. Here, the second conductive layer 175 is also formed on the edge portion of the substrate and on the sacrificial layer pattern 115a located near the edge of the substrate. Then, an HSG silicon layer 150 is formed on the surface of the second conductive layer 175.

Referring to FIG. 2D, a protective layer 155 is formed on the surface of the HSG silicon layer 150 which covers the second conductive layer 175. The protective layer 155 is formed from USG (undoped silicate glass) constituted by silicon oxide material utilizing a low pressure chemical vapor deposition method.

Then, the protective layer 155 and the second conductive layer 175 are subjected to an etch-back process. Here, to prevent any polysilicon from remaining on the edge portion of the substrate after the etch-back process, portions of the protective layer 155 covering the edge of the substrate are first removed by an additional photolithography process prior to the etch-back process, as described in detail below.

Particularly, as shown in FIG. 2D, a second photoresist film 157 is formed by coating a photoresist on the surface of the protective layer 155. Then, as shown in FIG. 2E, the portion of the second photoresist film 157 which is on the edge of the substrate is removed to form a photoresist pattern 157a, by selectively light exposing and developing the edge portion of the semiconductor substrate. By forming this photoresist pattern 157a, a portion 155b of the protective layer 155 on the periphery of the substrate near the edge is exposed. Then, utilizing the photoresist pattern 157a as an etching mask, the peripheral protective layer 155b is removed by an etching process, as shown by the dotted line in FIG. 2E, to expose the peripheral portion of the HSG silicon layer located close to the edge of the substrate. Thereafter, by utilizing a wet-etching process with a polysilicon etchant, a portion of the second conductive layer 175a and a portion of the HSG silicon layer 150a, as shown by the dotted line, are removed. Then the second photoresist pattern 157a is removed by stripping process.

After the steps shown in FIG. 2E, the protective layer 155 is subjected to an etch-back process. Here, as shown in FIG. 2F, because the sacrificial layer 115 is also constituted by the same silicon oxide material which makes up the protective layer 155, a portion of the sacrificial layer 115a located on the edge of the substrate is simultaneously partially etched by the etch-back process. As a result of the above described processes, the peripheral protective layer 155b, a portion of the second conductive layer 175a, and a portion of the HSG silicon layer 150a, all being located on the periphery near to the edge of the substrate, have been removed.

Referring to FIG. 2G, utilizing the protective layer residue 155a as an etching mask, the remaining HSG silicon layer 150 and the second conductive layer 175 near to the edge of the substrate, covering the upper portion of the sacrificial layer 115, are etched-back until the upper portions of the sacrificial layer 115 and the sacrificial layer pattern 115a are exposed. As a result of this process, as shown, all portions of the HSG silicon layer 150 and the second conductive layer 175 formed on the periphery and very near to the edge of the substrate are now completely removed; hence, a formation of a silicon bridge can be prevented.

According to the method described above, in order to prevent the formation of a silicon bridge, prior to subjecting the protective layer and the second conductive layer to an etch-back process, the protective layer located at the periphery and on the edge of the substrate is preliminarily removed to expose the polysilicon formed at the same location. Once exposed, the polysilicon is then removed by a wet-etching process to render a semiconductor substrate free of polysilicon at its edge and peripheral region. For processing the edge of the substrate, the method is accompanied by a photoresist coating, development, and etching processes.

SUMMARY OF THE INVENTION

It is a first object of the present invention to provide a dry-etching gas etchant composition for efficiently etching-back both polysilicon and silicon oxide to prevent formation of a silicon bridge caused by polysilicon residues in a manufacturing process of a capacitor.

It is a second object of the present invention to provide a method for dry-etching both silicon oxide and polysilicon utilizing the above dry-etching gas etchant composition.

It is a third object of the present invention to provide a method for manufacturing a capacitor for semiconductor devices which prevents formation of a polysilicon bridge by a process which utilizes polysilicon layers.

In order to achieve the first object, the present invention provides a dry-etching gas etchant composition comprising carbon tetrafluoride gas and nitrogen gas for simultaneously etching both polysilicon and silicon oxide at substantially similar etching rates during an etch-back process. Here, an etching rate ratio of polysilicon to silicon oxide is about 0.8–1.2:1, preferably about 0.9–1.1:1, and a mixing ratio of carbon tetrafluoride gas and nitrogen gas is about 25–40:1, preferably about 28–38:1.

In order to achieve the second object, the present invention provides a method for simultaneously etching both a polysilicon layer and a silicon oxide layer covering the polysilicon layer formed on a semiconductor substrate at substantially similar etching rates by utilizing the above gas etchant composition.

For etching the polysilicon layer and the silicon oxide layer, a mixed gas etchant composition comprising carbon tetrafluoride gas and nitrogen gas at a pressure of about 5–20 mTorr is utilized.

In order to achieve the third object, the present invention provides a method for manufacturing a capacitor for semiconductor device by utilizing a gas etchant composition comprising carbon tetrafluoride gas and nitrogen gas and a method for simultaneously etching polysilicon and silicon oxide layers. In this method, an insulating layer is first formed on a semiconductor substrate, wherein the insulating layer has an opening to be defined as a cell unit, followed by forming a first conductive layer having a continuous structure of polysilicon on a surface of the insulating layer, an inner-surface of the opening, and a surface of an underlying layer exposed by the opening. A protective layer comprising silicon oxide fills the opening and is formed on the first conductive layer. Then, a first conductive pattern defined with a cell unit is formed by simultaneously etching-back the protective layer and the first conductive layer at substantially similar etching rates until an upper portion of the insulating layer is exposed. Thereafter, the insulating layer and residues from the protective layer after the etch-back process are removed, followed by forming a dielectric film and a second conductive layer on the first conductive layer to obtain a resulting capacitor.

According to a preferred embodiment of the present invention, an HSG silicon layer is formed on the surface of the first conductive layer to obtain a rugged surface of the storage electrode.

According to another preferred embodiment of the present invention, prior to the etch-back process, the edge of the substrate is physically covered to protect the sacrificial layer and the first conductive layer from the gas etchant during the etch-back process. Here, the method of physically covering the edge of the substrate is accomplished by utilizing a clamp.

According to the present invention, because polysilicon and silicon oxide layers are simultaneously etched at substantially similar etching rates by utilizing the same etching equipment, a composite layer having both polysilicon and silicon oxide materials constituted therein can be effectively etched to obtain a surface having a good profile. Specifically, in the subsequent process of manufacturing capacitors for semiconductor memory devices, after forming a polysilicon pattern for a storage electrode by etching-back a composite layer comprising both a silicon oxide layer constituted by oxide material and a conductive layer constituted by polysilicon material, a formation of a polysilicon bridge caused by detachments or dislodging of polysilicon residues can be prevented.

The present invention also provides a method for manufacturing a capacitor for semiconductor devices by utilizing a clamp in an etch-back process for manufacturing a capacitor of a semiconductor device. According to this method, an insulating layer comprising an opening to be defined as a cell unit is formed on a semiconductor substrate, then a first conductive layer which comprises polysilicon and has a continuous structure on a surface of the insulating layer, an inner-surface of the opening, and on a surface of an underlying layer exposed by the opening, is formed. The first conductive layer has a well corresponding to the opening. Thereafter, a protective layer comprising silicon oxide for filling the well in the first conductive layer is formed, followed by forming a first conductive pattern defined with a cell unit by etching-back the protective layer and the first conductive layer until an upper portion of the insulating layer is exposed, while physically covering an edge of the semiconductor substrate. After the etch-back process, the insulating layer and residues from the protective layer are removed, then a dielectric film and a second conductive layer are formed on the first conductive layer to obtain a resulting capacitor.

During the above described etch-back process of etching the protective layer and the conductive layer constituted with polysilicon, because the periphery and the edge of the semiconductor substrate is covered by utilizing a clamp, a separate and additional photolithography process which conventionally accompanies the manufacturing process for removing polysilicon formed on the periphery and the edge of the substrate is no longer needed; hence, an increased manufacturing output can be achieved.

BRIEF DESCRIPTION OF THE ATTACHED DRAWINGS

The above objects and other advantages of the present invention will become more apparent by describing in detail embodiments thereof with reference to the attached drawings in which.

DETAILED DESCRIPTION OF THE PREFERRED EMBODIMENTS

Figure 1A:
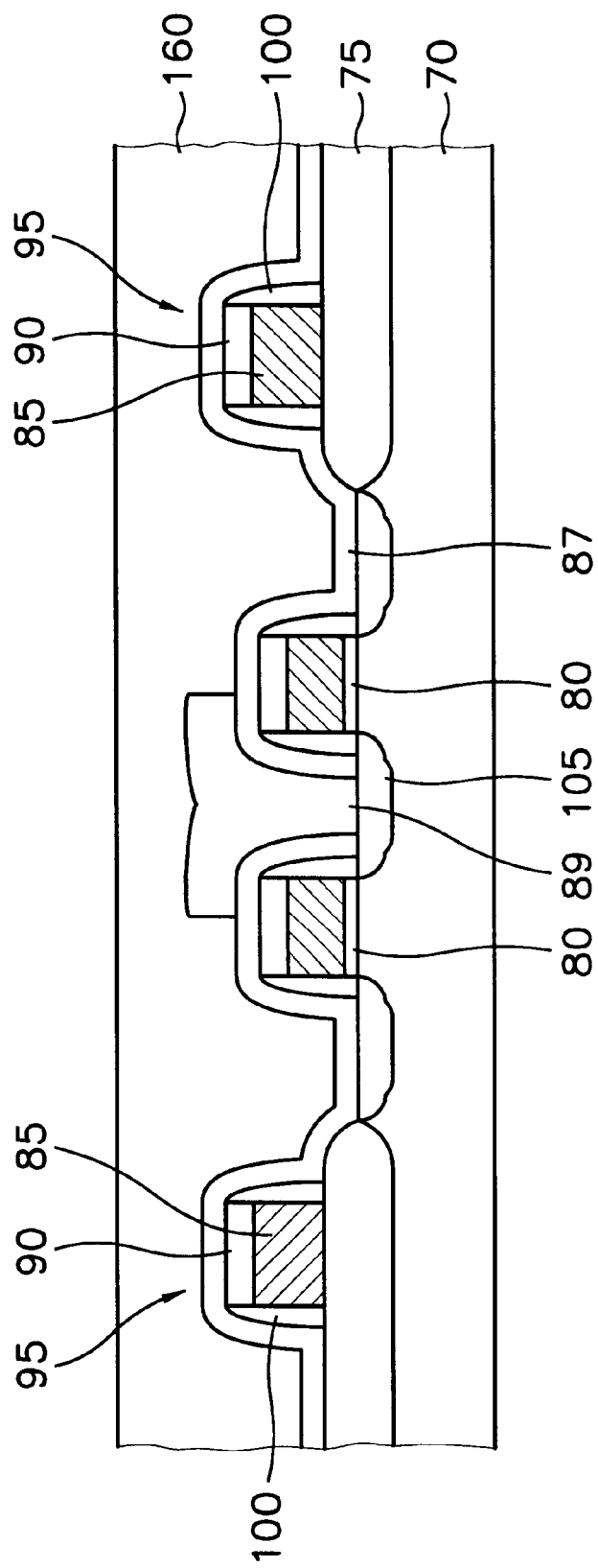
FIGS. 1A to 1J are sectional views illustrating a conventional manufacturing process of a semiconductor device comprising a capacitor having a cylindrical shape.
Figure 1B:
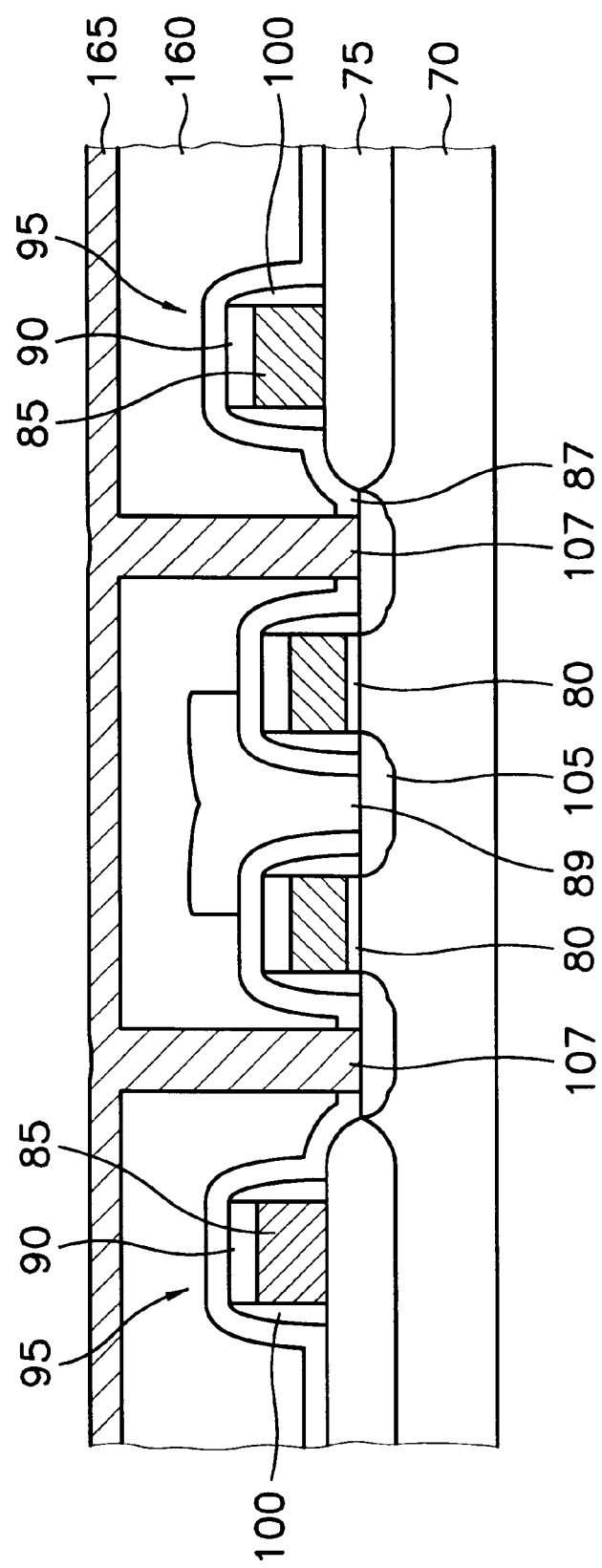
Figure 1C:
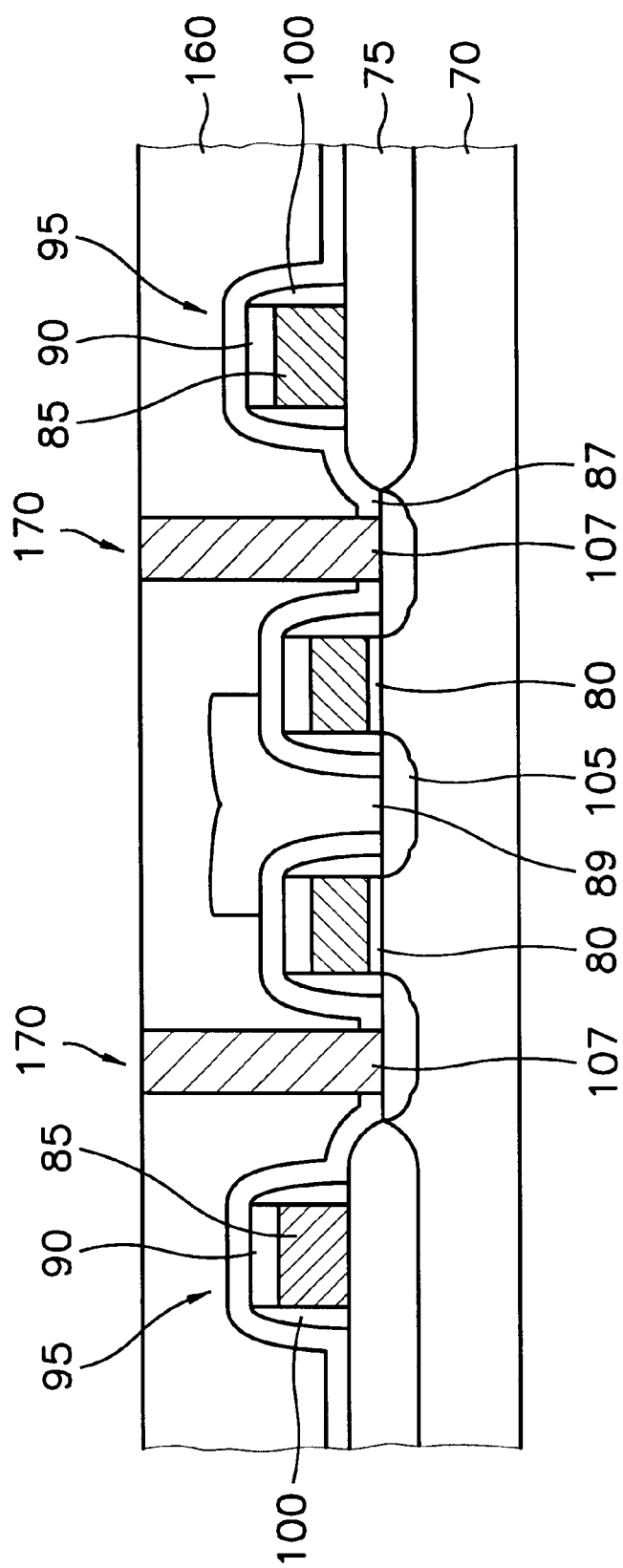
Figure 1D:
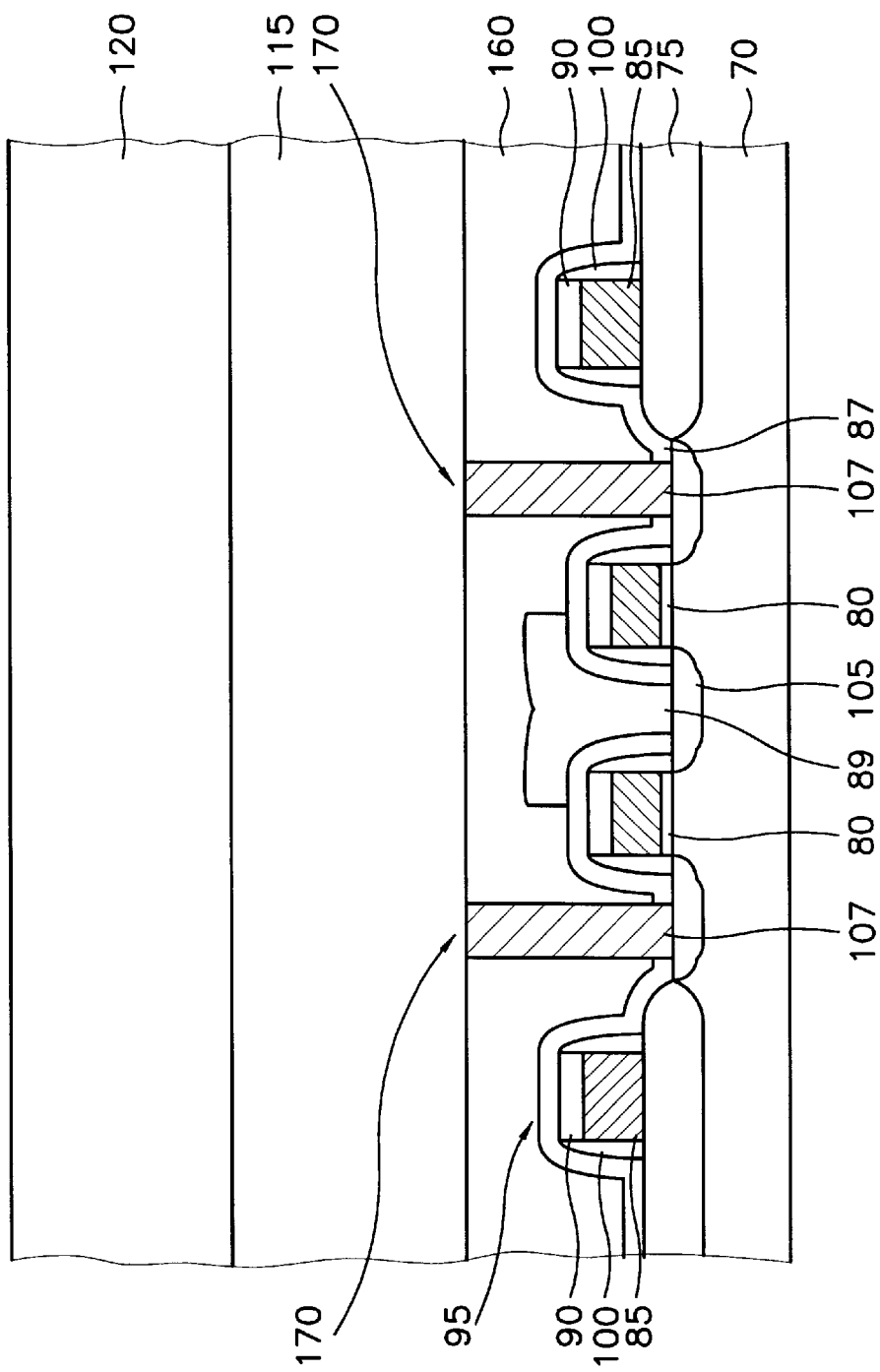
Figure 1E:
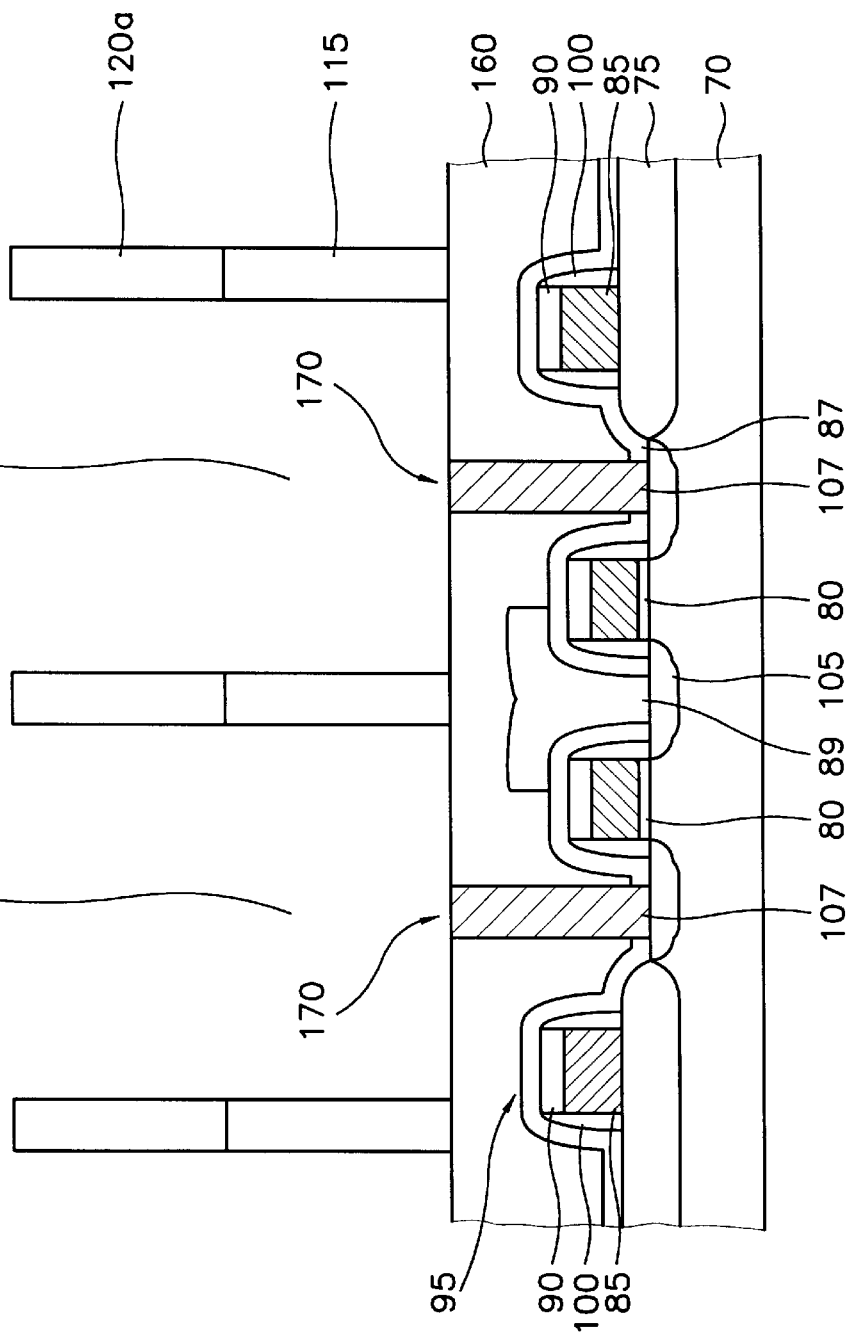
Figure 1F:
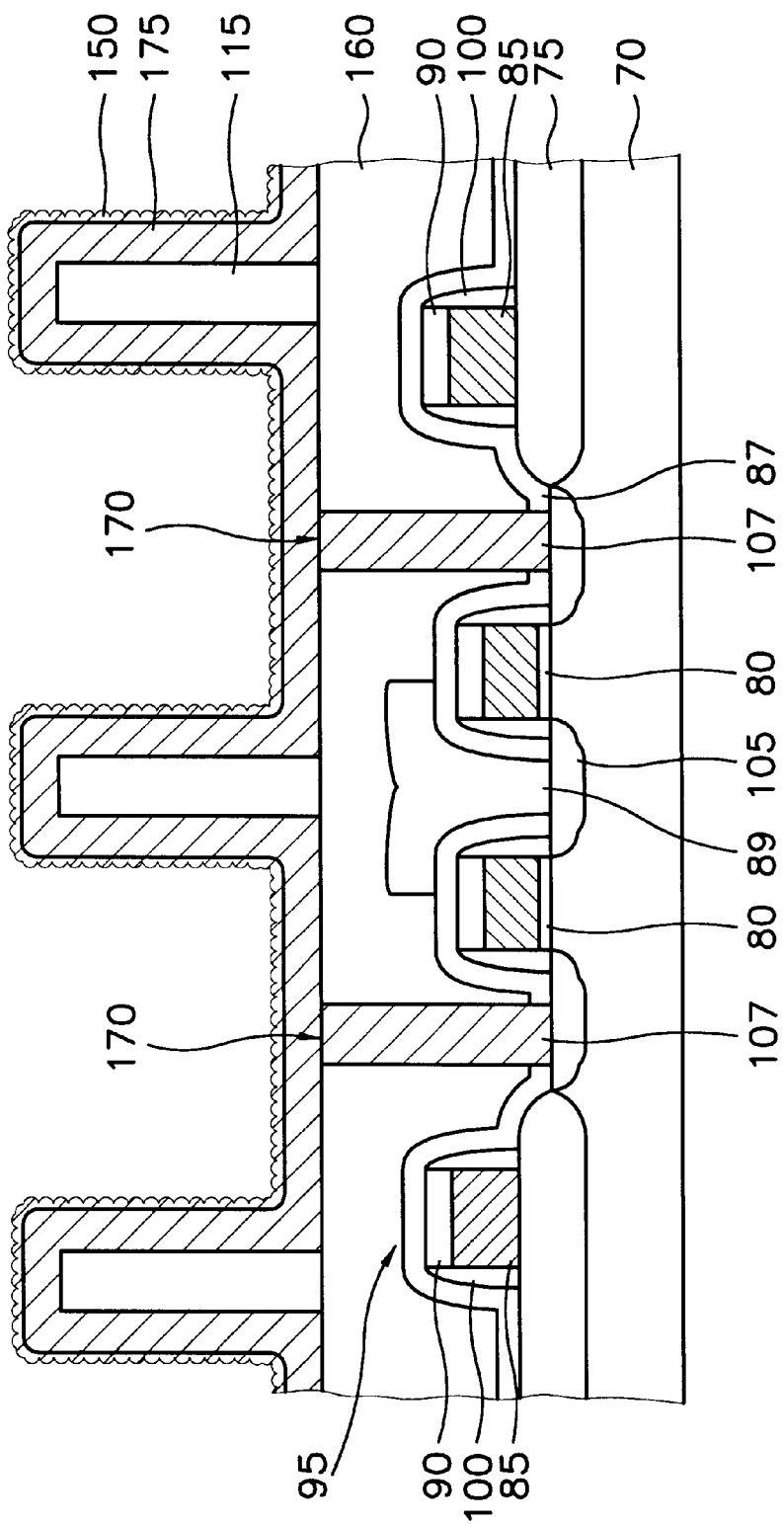
Figure 1G:
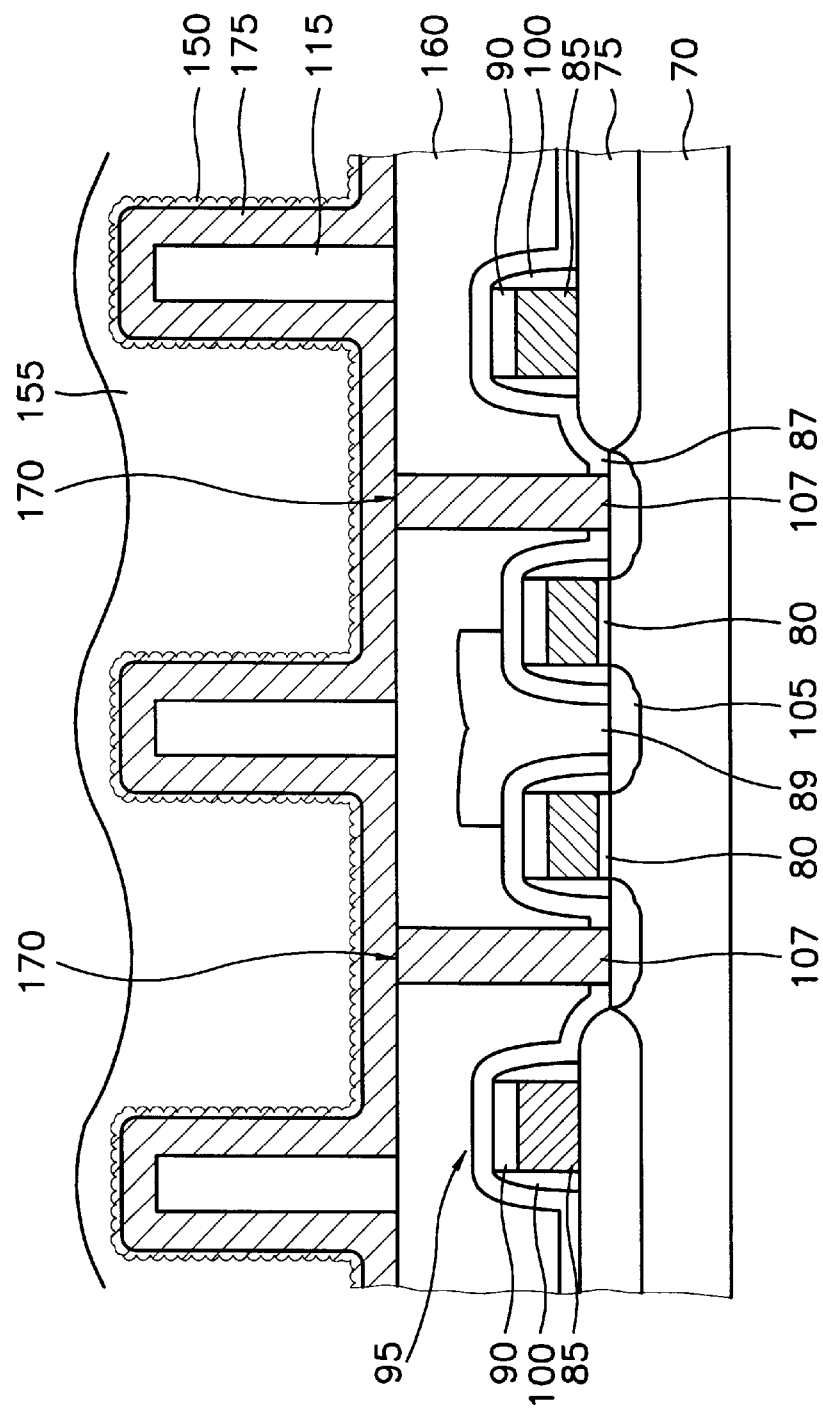
Figure 1H:
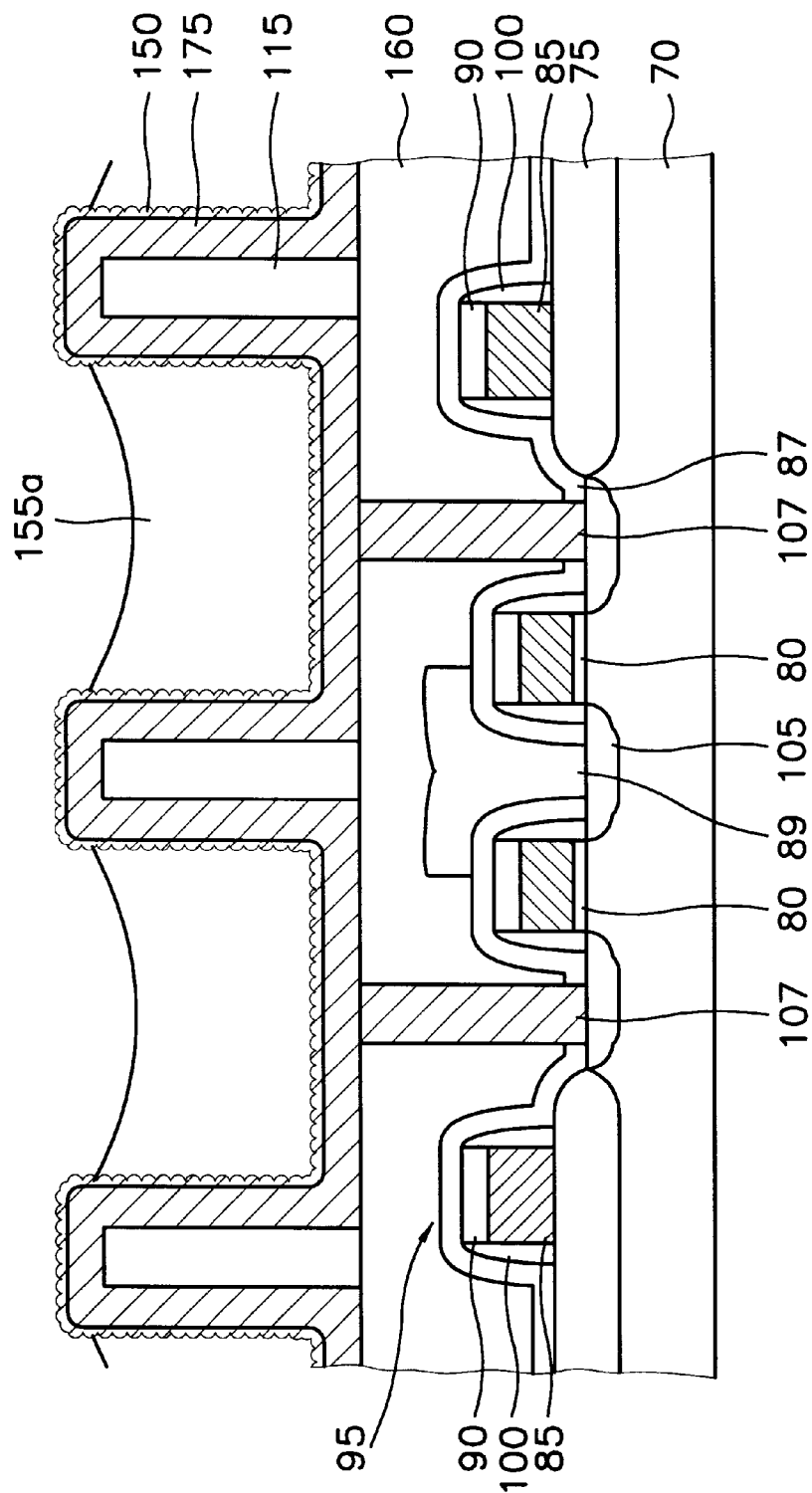
Figure 1I:
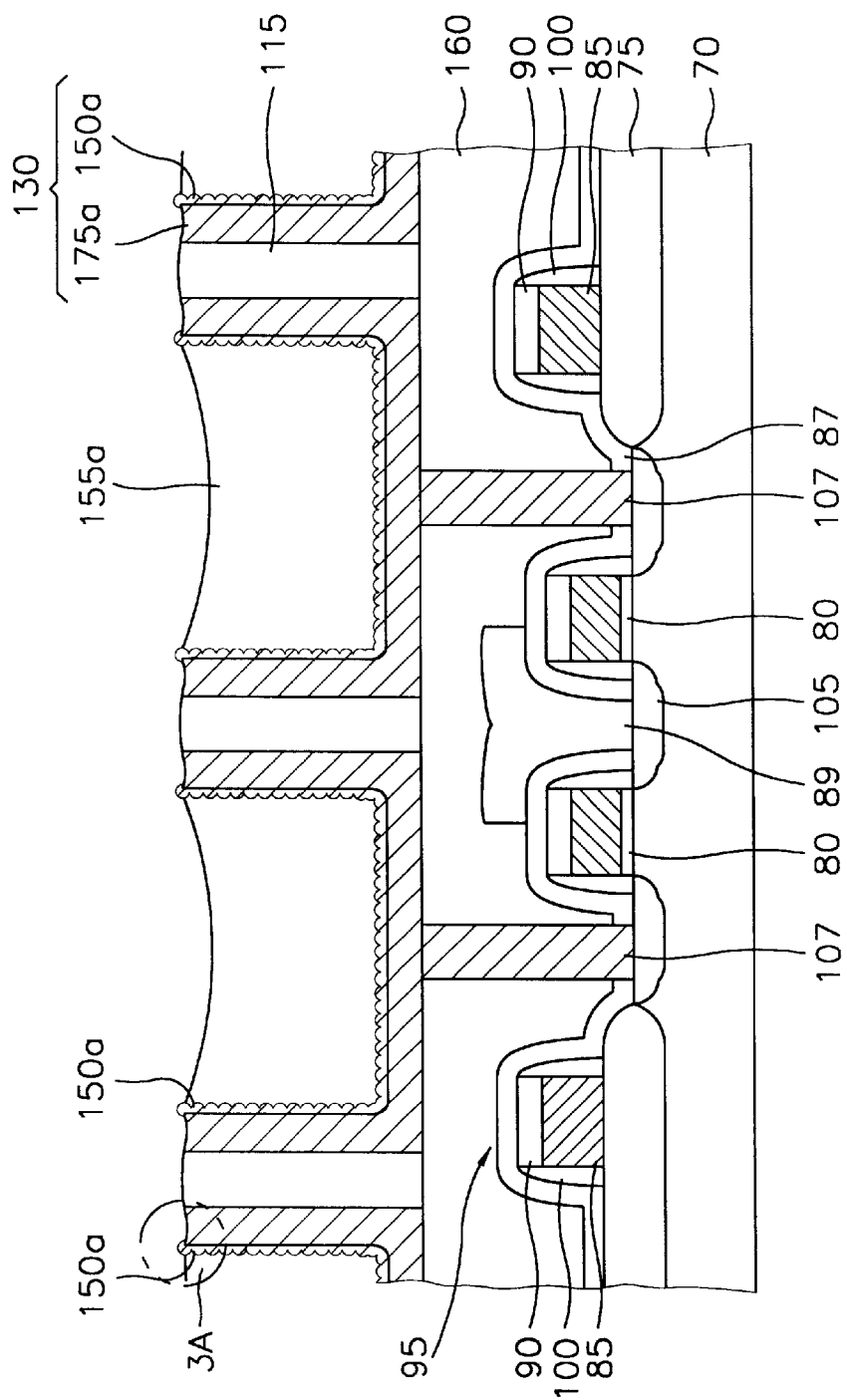
Figure 1J:
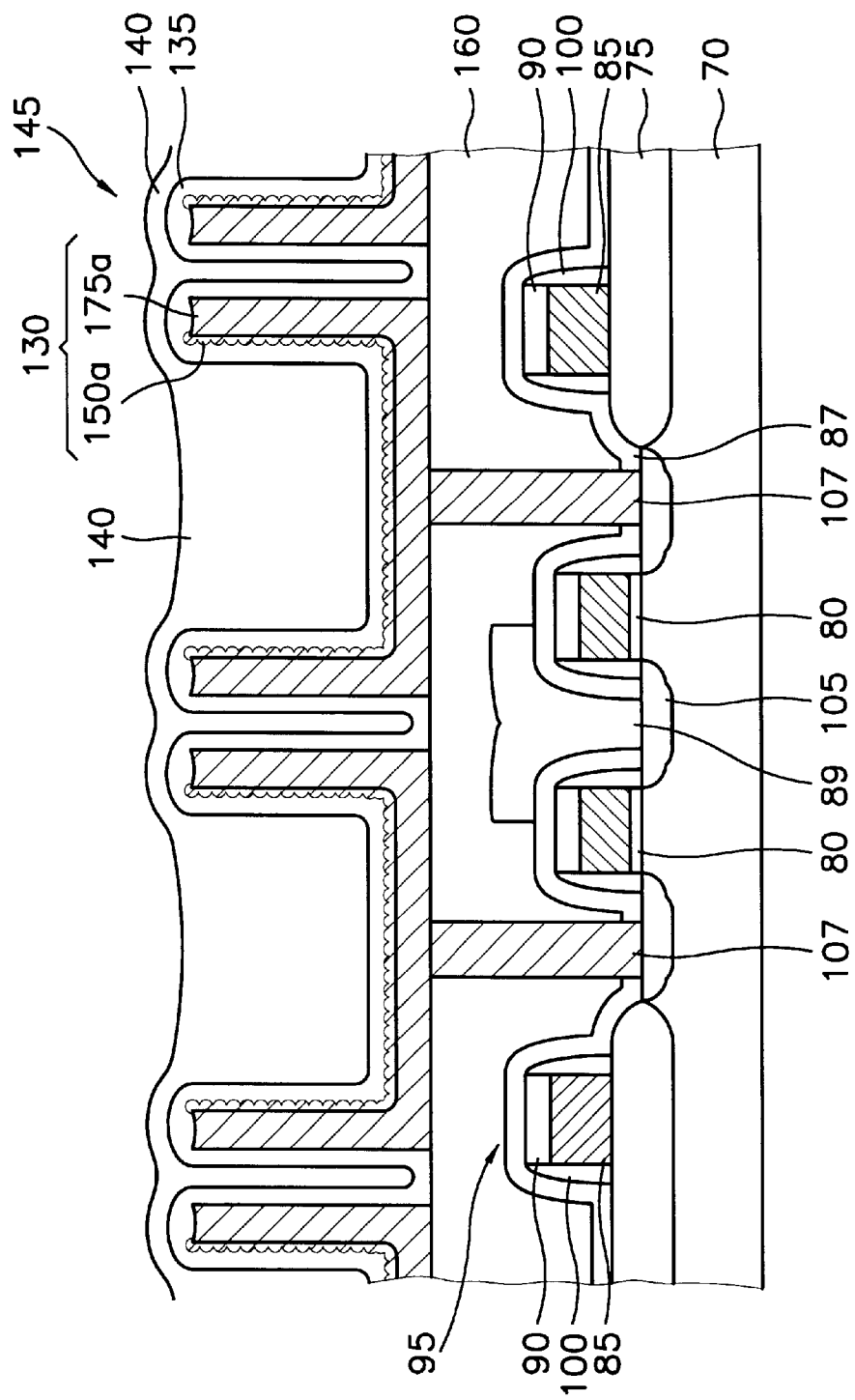
Figure 2A:
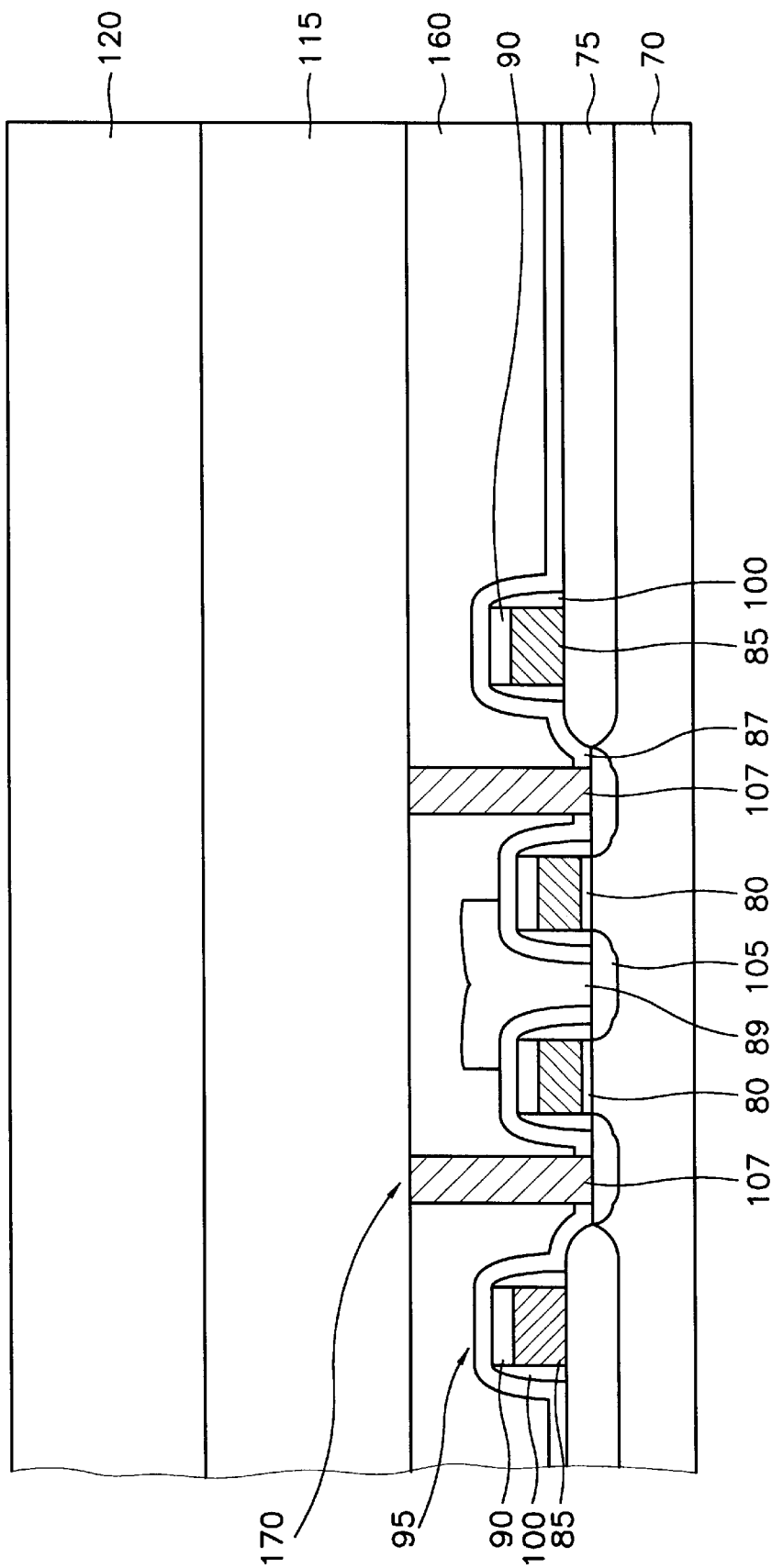
FIGS. 2A to 2F are sectional views illustrating an additional conventional photolithography process for processing an edge portion of a semiconductor substrate illustrated in FIGS. 1D to 1I.
Figure 2B:
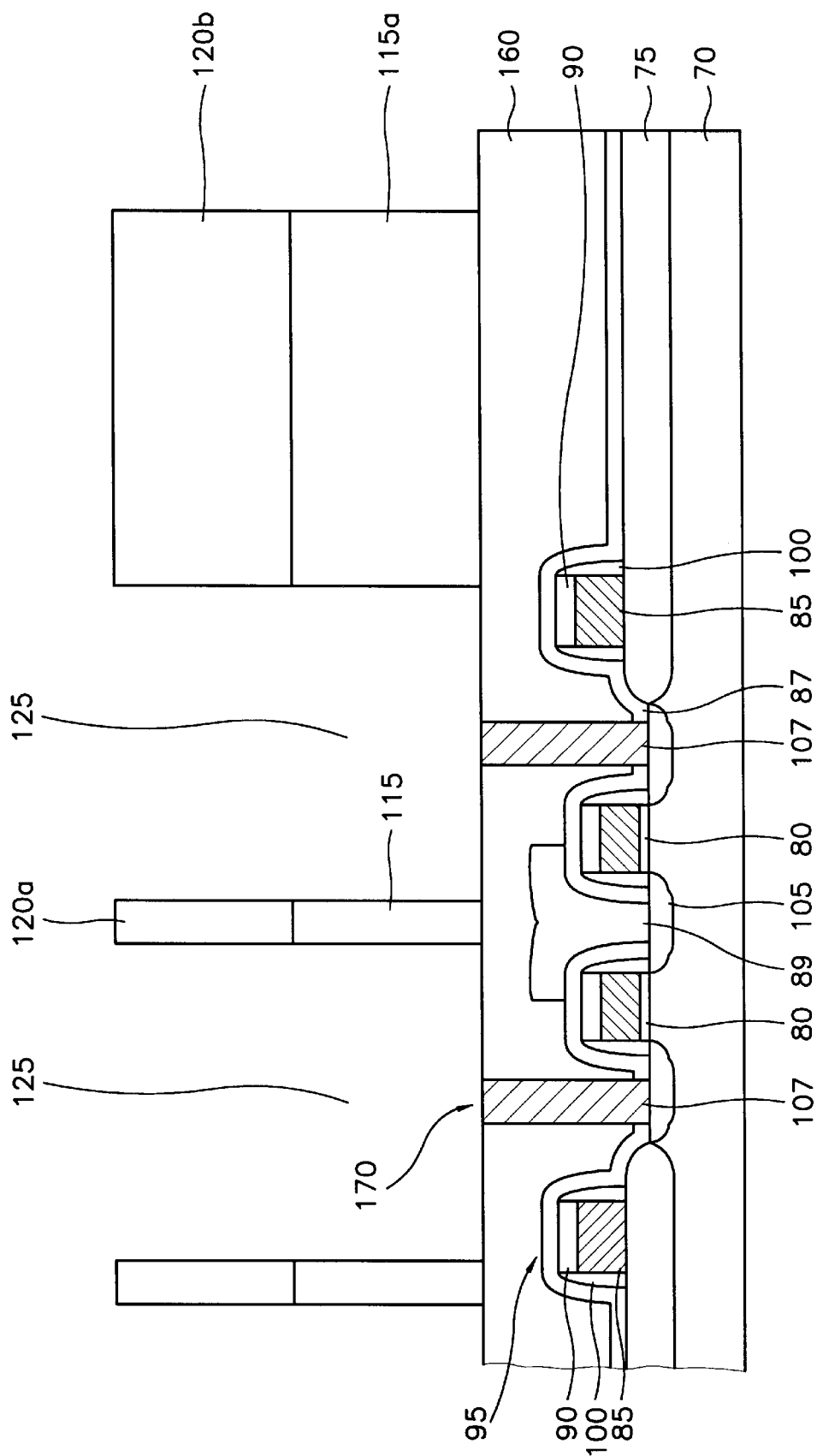
Figure 2C:
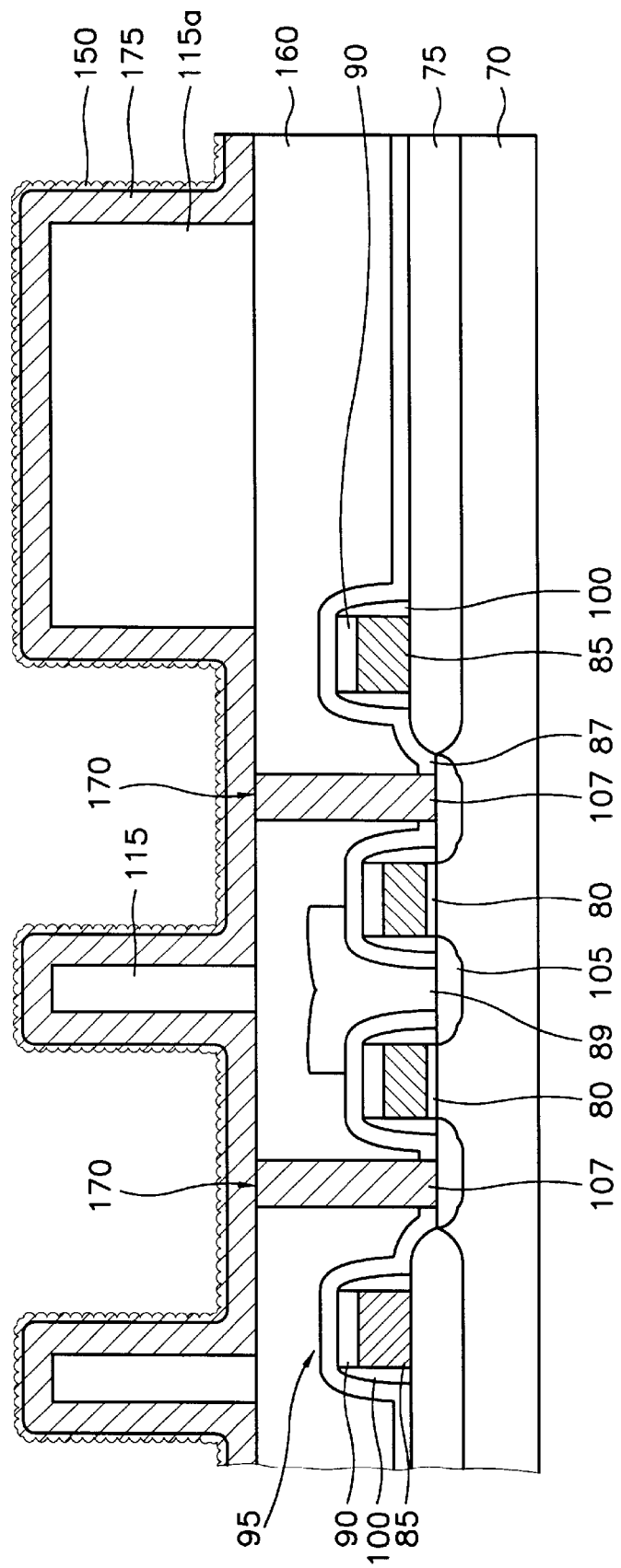
Figure 2D:
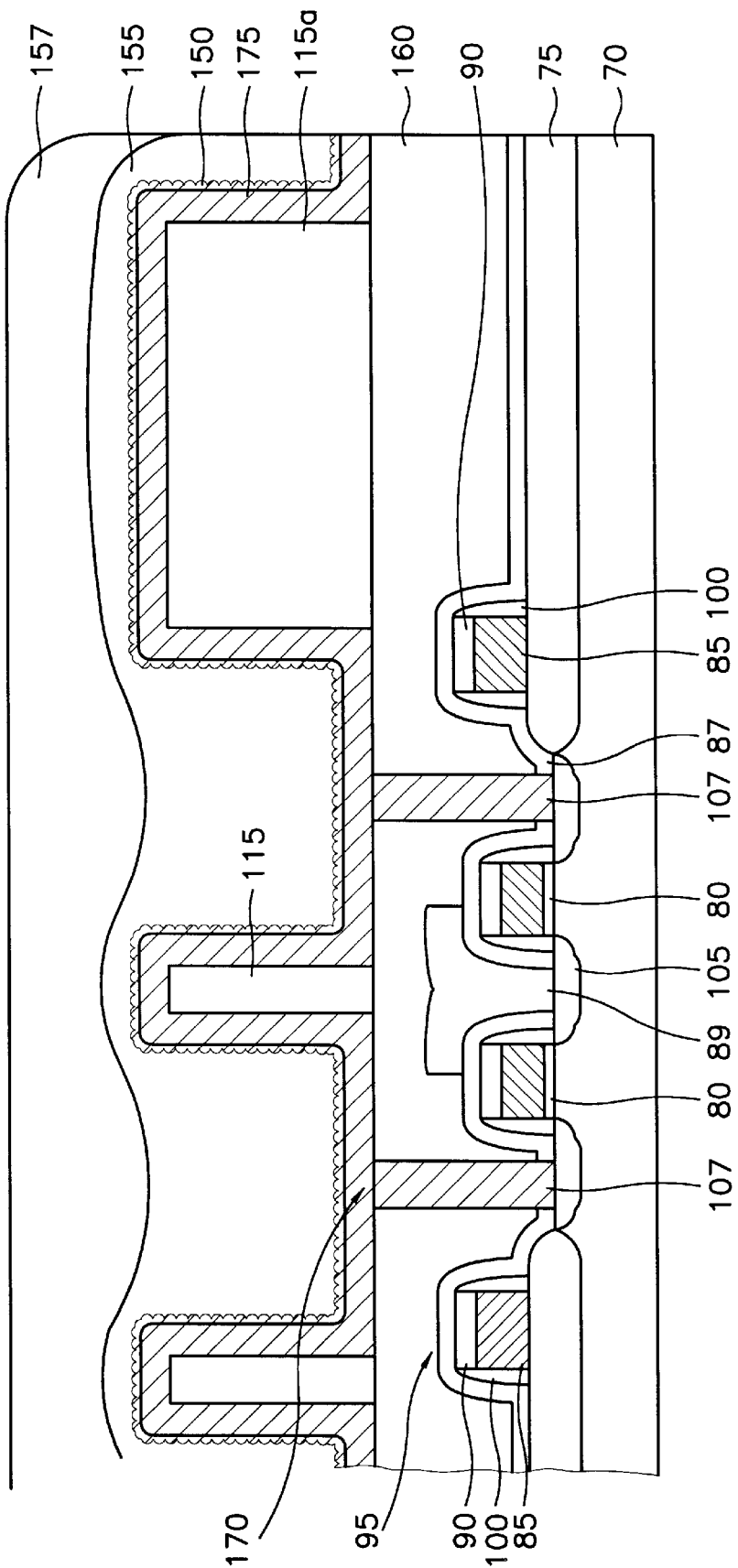
Figure 2E:
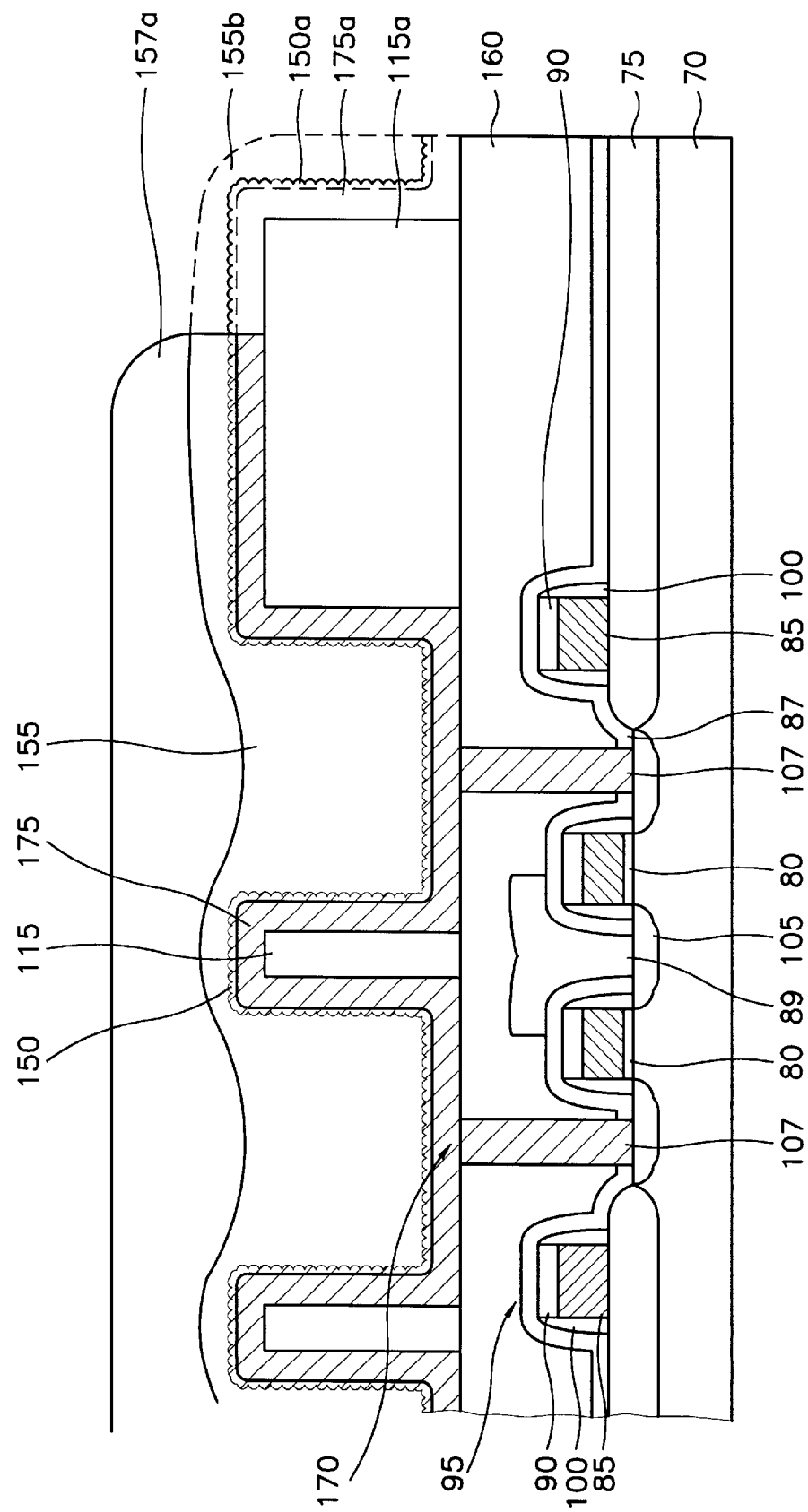
Figure 2F:
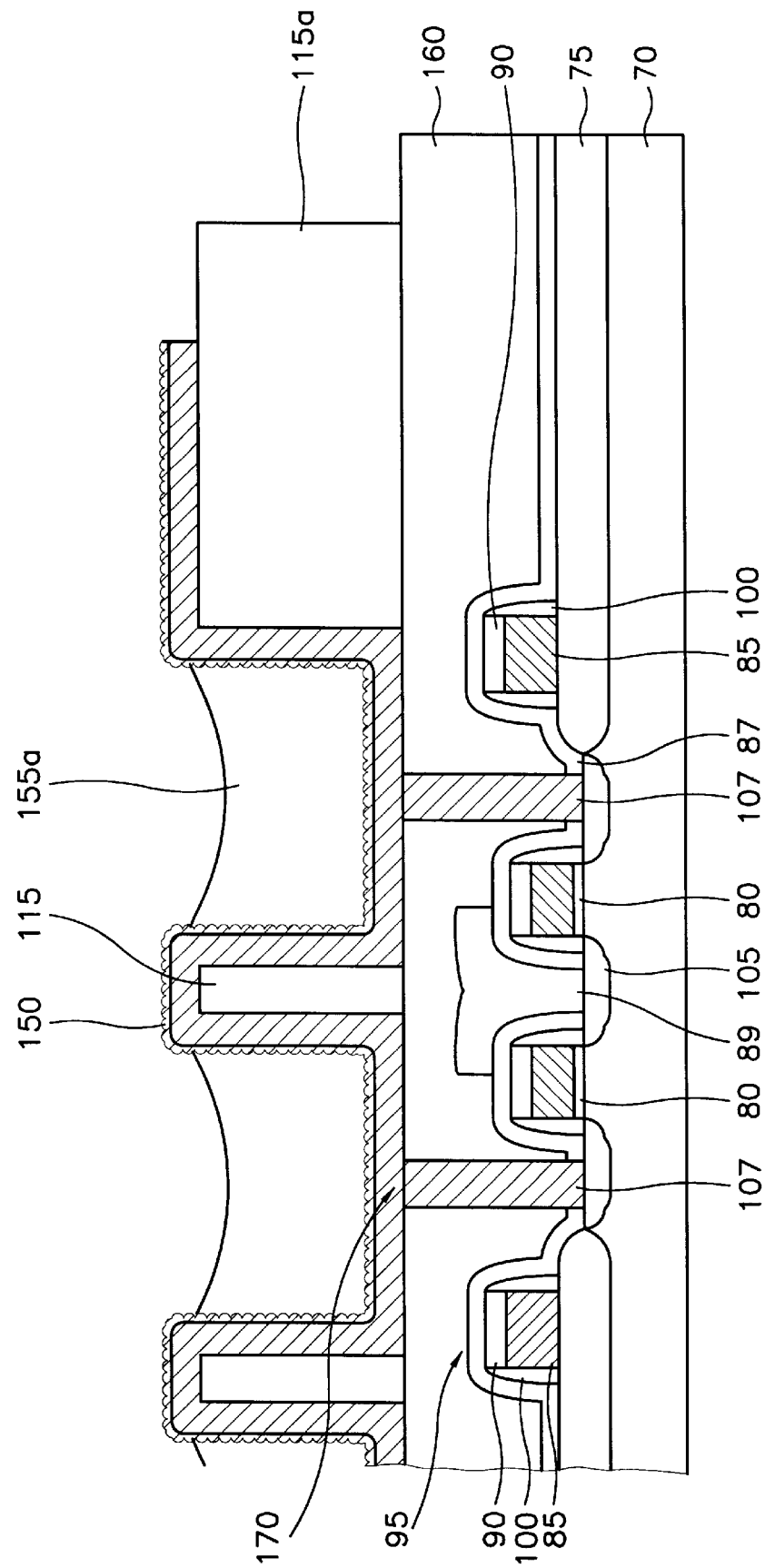
Figure 2G:
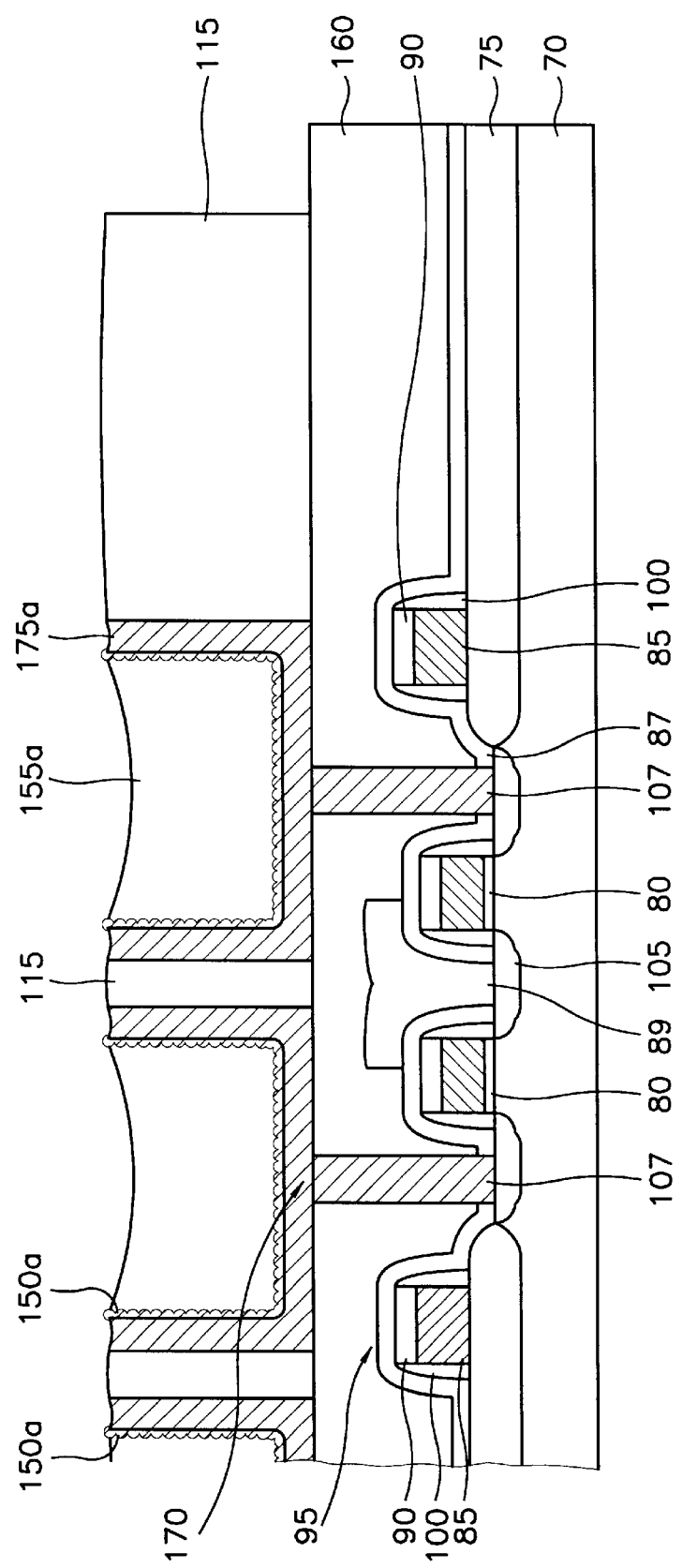
Figure 3A:
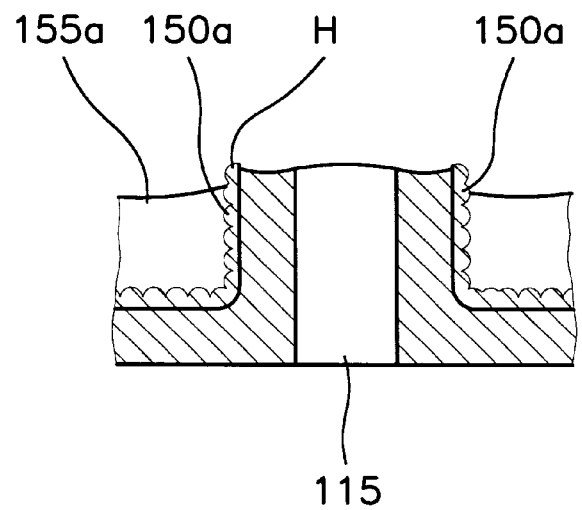
FIG. 3A is an enlarged sectional view of a portion 3A of FIG. 1I.
Figure 3B:
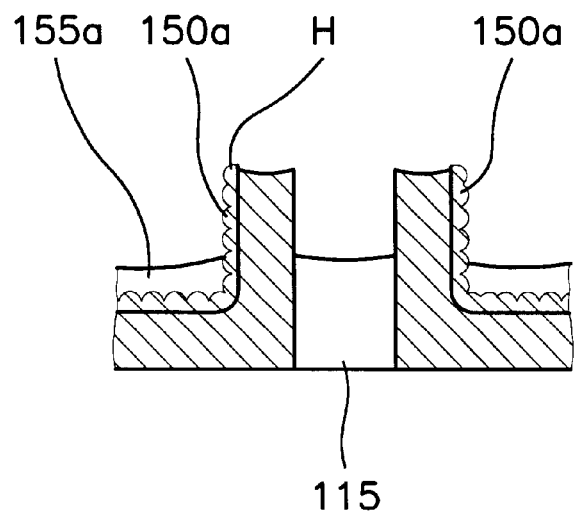
FIG. 3B is a sectional view illustrating a process of wet-etching the sacrificial layer of FIG. 3A.

The present invention will now be described in detail below. According to the present invention, a gas etchant for dry-etching comprises carbon tetrafluoride gas and nitrogen gas. A mixed gas of $CF_4$ and oxygen, $CF_3Cl$ gas, a mixed composition of fluorocarbon type compound and chloride gas, and a mixed composition of carbon tetrachloride gas and argon gas conventionally utilized for selectively etching polysilicon in a composite layer having both polysilicon and silicon oxide, and carbon tetrafluoride gas, $C_2F_4$ gas, and $CHF_3$ gas conventionally utilized for selectively etching silicon oxide in the composite layer are not suitable for simultaneously etching both polysilicon and silicon oxide, due to a drastic difference in their etching selectivity. Fluorocarbon type compounds, which release fluoride ions in the presence of plasma for reacting with silicon, are widely used as a main constituent in etching gas compositions. More specifically, a fluoro-carbon type compound, such as carbon tetrafluoride $CF_4$, which reacts with polysilicon and silicon oxide to release $SiF_4$ and fluoro-silicates exhibits a high etching activity in oxide materials.

By utilizing the above carbon tetrafluoride gas in a number of experiments with polysilicon-etching equipment, the present inventors have found that the etching rate of carbon tetrafluoride in silicon oxide with respect to polysilicon can be decreased by adding nitrogen gas. As a result, the inventors have determined that a mixed gas etchant composition having carbon tetrafluoride gas and nitrogen gas, when mixed in an appropriate ratio, exhibits an etching rate selectivity of about 1 for polysilicon with respect to oxide.

In the repeated experiments by the present inventors, a number of etching processes utilizing plasma and the above mixed gas etchant having carbon tetrafluoride gas and nitrogen gas were tested on a semiconductor substrate formed with both polysilicon and silicon oxide layers. The etching rates for both polysilicon and silicon oxide layers for the varying amounts of carbon tetrafluoride gas, nitrogen gas, and oxygen gas at different pressures were observed and measured. The etching processes were carried out by utilizing TCP (transformer coupled plasma) polysilicon-etching equipment, and the etching rates measured for polysilicon and silicon oxide are shown by Table 1.

TABLE 1

Etching Rates Measured for Polysilicon and Silicon Oxide

| Pressure (mTorr) | TCP Output (watts) | Amount of $CF_4$ Gas (sccm) | Amount of Nitrogen Gas (sccm) | Amount of Oxygen Gas (sccm) | Silicon Oxide Etching Rate (Å/min) | Poly-silicon Etching Rate (Å/min) | Etching Selectivity Ratio (*) |
|---|---|---|---|---|---|---|---|
| 10 | 450 | 100 | | 3 | 2656 | 2326 | 1.4 |
| 13 | 200 | 100 | 5 | | 1136 | 850 | 0.7 |
| 10 | 500 | 150 | 5 | | 2198 | 2491 | 1.1 |
| 10 | 600 | 180 | 5 | | 2602 | 2709 | 1.0 |

(*)indicates polysilicon/silicon oxide etching selectivity ratio.

For etching-back a composite layer comprising polysilicon and silicon oxide layers, it is most appropriate to adjust the etching rates for polysilicon and silicon oxide layers to obtain an etching selectivity ratio of 1. However, for polysilicon and silicon oxide, it is difficult to obtain an exact etching selectivity ratio of 1, thus it is preferable to obtain an etching selectivity ratio which is as close to the value of 1 as possible. For example, a mixed gas etchant composition of the present invention having an etching selectivity ratio of 1.1 for polysilicon and silicon oxide is suitable for simultaneously etching-back a composite layer comprising both polysilicon and silicon oxide layers at substantially similar etching rates. Here, an etching rate for the polysilicon layer and an etching rate for the silicon oxide layer by the mixed gas etchant are substantially similar, as indicated by its etching selectivity ratio of 1.1 being very close to the etching selectivity ratio of 1, for rendering a surface of the composite layer lacking severe unevenness. As a result, formation of a polysilicon bridge caused by the detachments of HSG polysilicon particles can be effectively prevented. In view of the margin of etching processes and the resulting surface profile of a composite layer by the etching of polysilicon and silicon oxide layers, an etching ratio of the above polysilicon to silicon oxide is about 0.8–1.2:1, preferably about 0.9–1.1:1.

Here, silicon oxide is etched at a faster rate with respect to polysilicon at a carbon tetrafluoride gas and nitrogen gas mixing ratio (volume) of less than 25:1. Also, polysilicon is etched at a faster rate with respect to silicon oxide at a carbon tetrafluoride gas and nitrogen gas mixing ratio of greater than 40:1, a mixing ratio of carbon tetrafluoride gas and nitrogen gas is about 25–40:1, preferably about 28–38:1.

The above mixed gas etchant composition comprising carbon tetrafluoride gas and nitrogen gas is utilized at a pressure of about 5–20 mTorr, since at a pressure less than 5 mTorr it is difficult to obtain a desired selectivity due to a slow etching reaction caused by an inadequate amount of carbon tetrafluoride present, and at a pressure greater than 20 mTorr it becomes increasingly difficult to control the etching selectivity ratio.

According to the present invention, a polysilicon layer having prominences and depressions and a silicon oxide layer covering the polysilicon layer formed on a semiconductor substrate are simultaneously etched by the same gas etchant composition at substantially similar etching rates. Here, the above mixed gas etchant composition comprising carbon tetrafluoride gas and nitrogen gas is utilized for the etch-back process.

Although, any etching equipment can be used for the etch-back process, it is preferable to use etching equipment designed for etching polysilicon. By utilizing a polysilicon-etching equipment, an appropriate amount of nitrogen gas can be easily introduced during infusion of carbon tetrafluoride gas for simultaneously etching polysilicon and silicon oxide layers. Here, as described above, the etching equipment is utilized at a pressure of about 5–20 mTorr, and the flow rates of the carbon tetrafluoride gas and nitrogen gas are constantly maintained at a ratio of 25–40:1, preferably about 28–38:1.

Figure 4A:
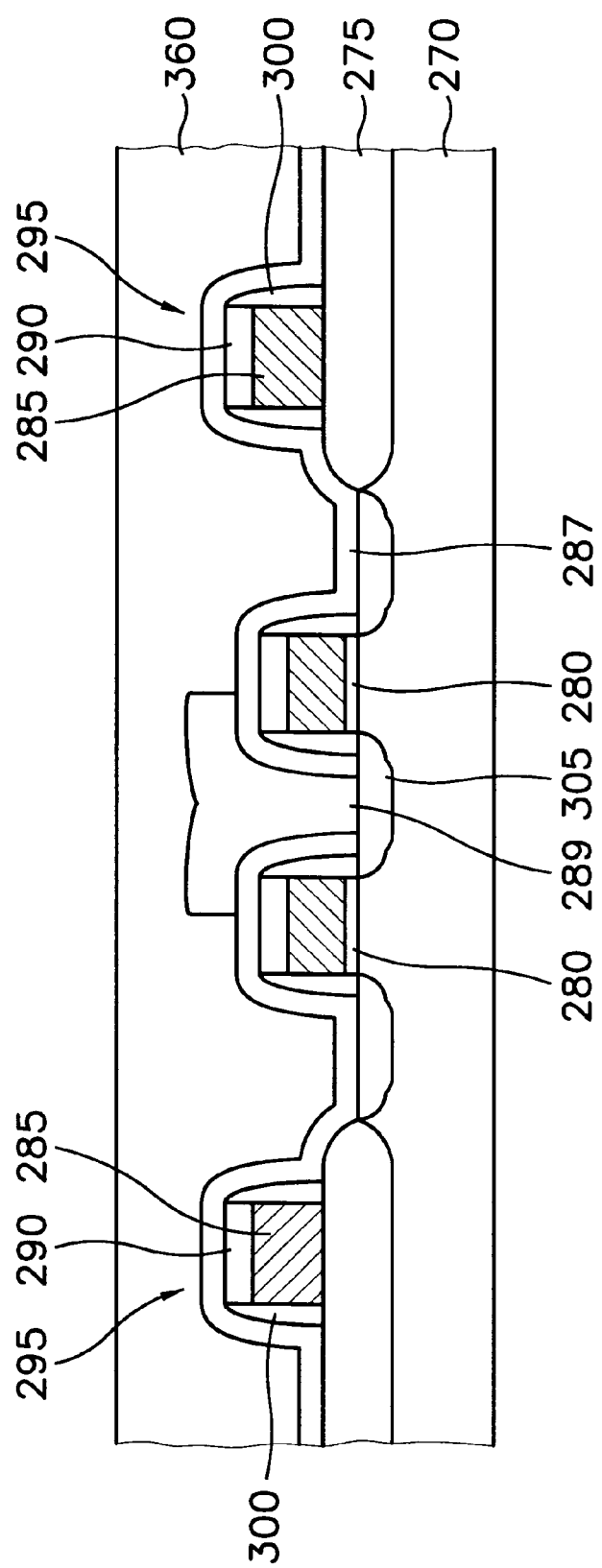
FIGS. 4A and 4I are sectional views illustrating a manufacturing process of a semiconductor device according to a preferred embodiment of the present invention.

Hereinafter, the preferred embodiment of a method for manufacturing a semiconductor device utilizing a gas etchant composition of the present invention will now be described in detail with reference to the attached drawings. FIGS. 4A and 4I are sectional views illustrating a manufacturing process of a semiconductor device according to a preferred embodiment of the present invention.

As shown by FIG. 4A, on a semiconductor substrate 270 fabricated from a semiconductor material such as silicon, a field oxide layer 275 for defining the active regions of various devices on the substrate 270 is formed by utilizing local oxidation of silicon (LOCUS). On the active region defined by the field oxide layer 275, a thin gate oxide layer 280 is formed by thermal oxidation. The above field oxide layer 275 has a thickness of about 2000–6000 Å, while the gate oxide layer 280 has a thickness of about 40–200 Å.

On the substrate 270 now being comprised of field oxide layer 275 and gate oxide layer 280, a first polysilicon layer and subsequently a first insulating film made from silicon oxide material are deposited. Then, a gate electrode 295 having a polysilicon pattern 285 and an insulating film pattern 290 is respectively formed on the field oxide layer 275 and the gate oxide layer 280 by selectively etching the first polysilicon layer and the first insulating film.

Here, the polysilicon pattern 285 is formed by etching the first polysilicon layer having a thickness of about 500–4000 Å, which has been obtained by a low pressure chemical deposition (LPCVD) method, while the insulating film pattern 290 is formed by etching the first insulating film having a thickness of about 500–2000 Å, which has been obtained by a low pressure chemical vapor deposition method or a plasma enhanced chemical vapor deposition method (PECVD).

Then, on the substrate 270 comprising gate electrodes 295, a second insulating layer having a thickness of 1000–4000 Å is formed from an oxide material such as HTO (high temperature oxide) by a low pressure chemical vapor deposition method or a plasma enhanced chemical vapor deposition method, followed by forming a spacer 300 on the side wall of the respective gate electrodes 295 by etching the second insulating layer using an anisotropic etching process.

Then, utilizing the gate electrode 295 as a mask, a source/drain region 305 is formed by introducing impurities on the active region by an ion implantation method. Here, in addition to CMOS which is conventionally used in the memory devices as an access transistor, various other access transistors including FET and MOFET can be used in the present invention.

Thereafter, an insulating interlayer 360 comprised of BPSG or PSG material is formed on the substrate 270 having a gate electrode 295. The insulating interlayer 360 having a thickness of about 2000–10000 Å is obtained by a low pressure chemical vapor deposition method or a plasma enhanced chemical vapor deposition method. Then, in preparation for the subsequent deposition and patterning processes, the upper portion of the insulating interlayer 360 is planarized by a chemical mechanical polishing process. In the present embodiment, although not shown, an etch-stop layer composed of silicon nitride material may be formed on the upper portion of the planarized insulating interlayer 360 to protect the insulating interlayer 360 from being etched in the subsequent process of etching a sacrificial layer 315.

Figure 4B:
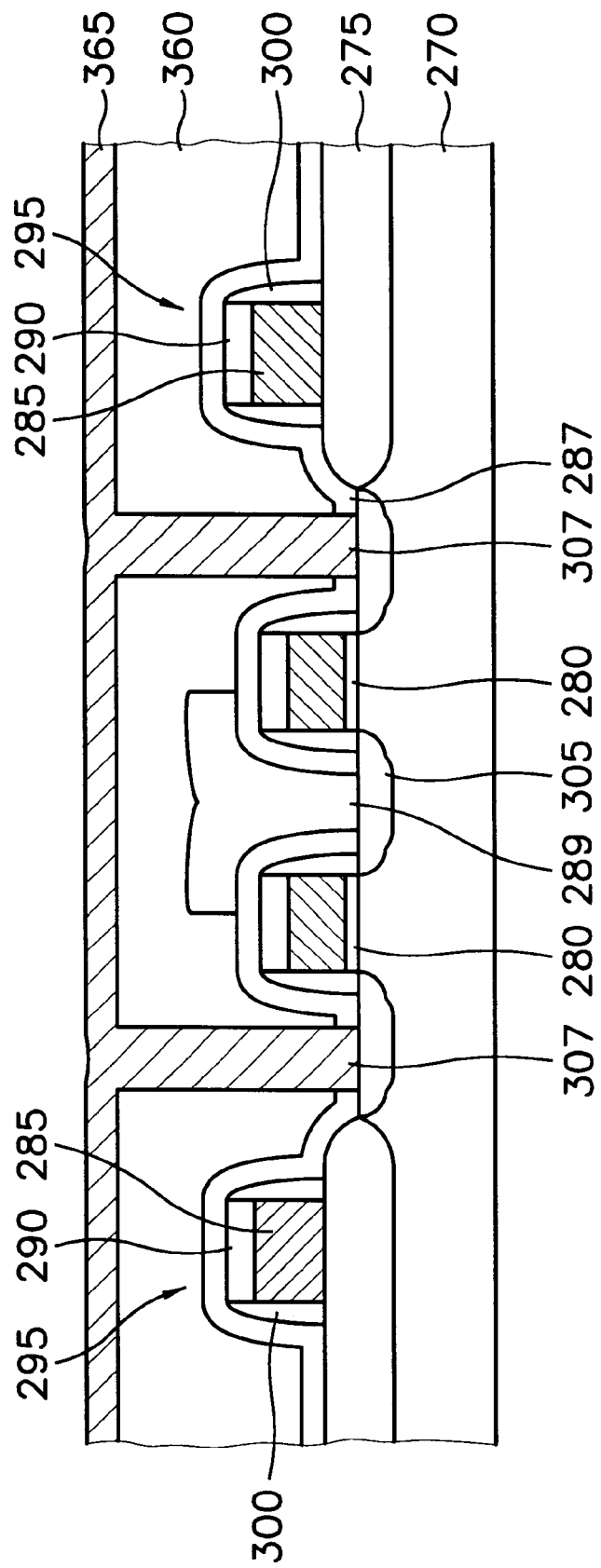
Figure 4C:
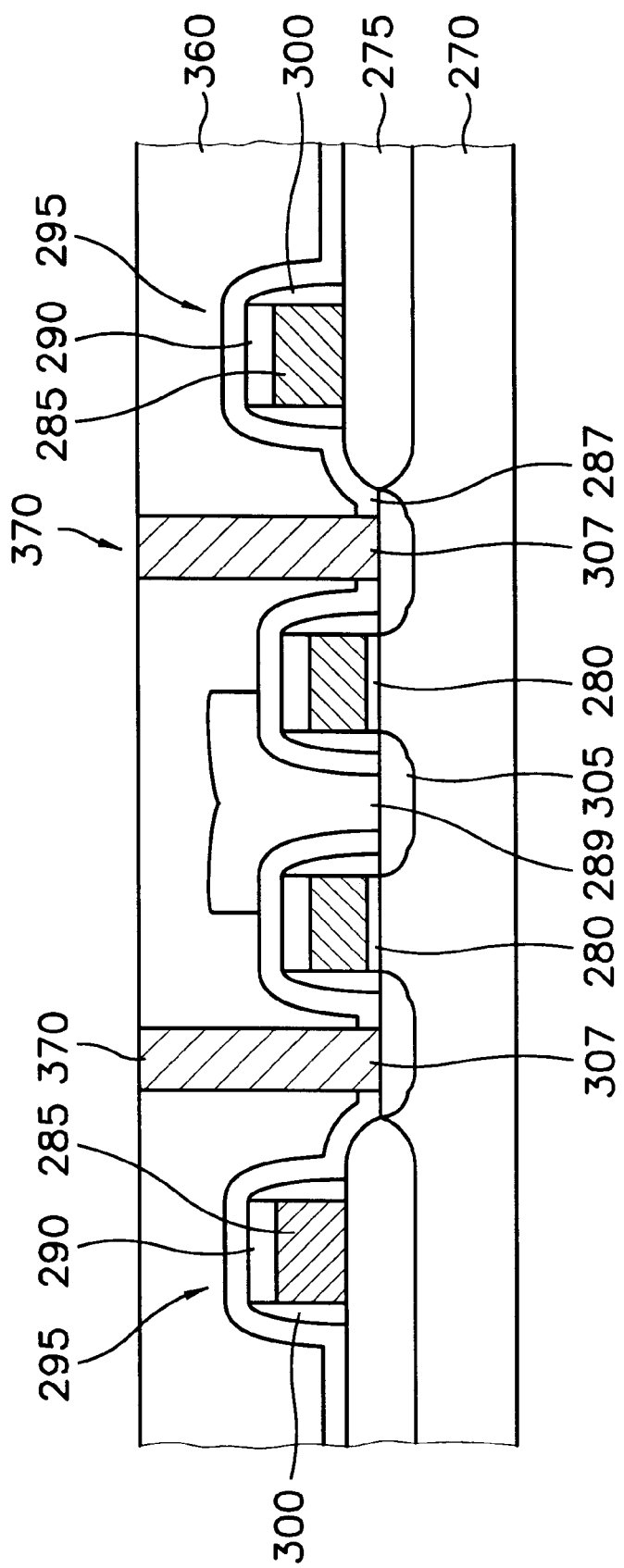

Referring to FIG. 4B, the insulating interlayer 360 is subjected to a conventional photolithography method to form a contact hole 307 for exposing a source/drain region 305. By filling the contact hole 307, a first conductive layer 365 is formed on the upper portion of the insulating interlayer 360. The first conductive layer 365 is formed by depositing polysilicon by a low pressure chemical vapor deposition method. Referring to FIG. 4C, by utilizing an etch-back process or CMP process, the first conductive layer 365 is etched to form a contact 370 in the contact hole 307 communicating with the source/drain region 305.

Figure 4D:
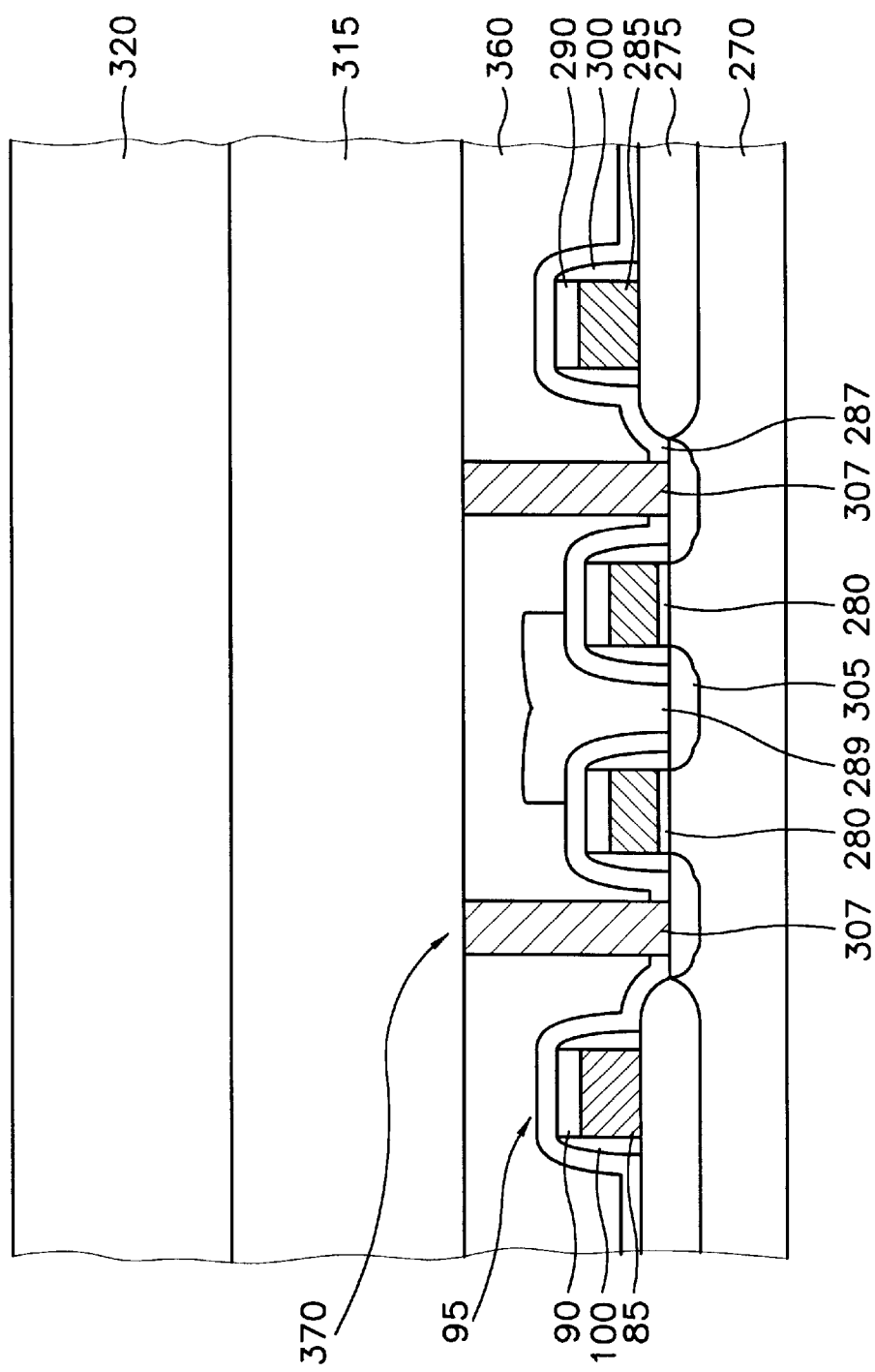

Referring to FIG. 4D, on the common surface of the contact 370 and the second insulating interlayer 360, a sacrificial layer 315 comprising oxide material such as BPSG, PSG, USG, or the like is formed. Here, for example, on the surface of the substrate 270, a sacrificial layer 315 comprising BPSG material and having a thickness of greater than 10000 Å, i.e., 13000 Å, can be realized by utilizing TEOS (tetraethyl-orthosilicate) reaction gas.

Referring to FIG. 4E, the photoresist film 320 formed on the surface of the thus-obtained sacrificial layer 315 is then subjected to a photo-process to form a photoresist pattern 320a. Using the photoresist pattern 320a as a mask, the sacrificial layer 315 is etched to form holes 325 for exposing the contact 370 and the surrounding second insulating interlayer 360 (which is an underlying layer of the sacrificial layer 315) in their respective cell units.

Figure 4F:
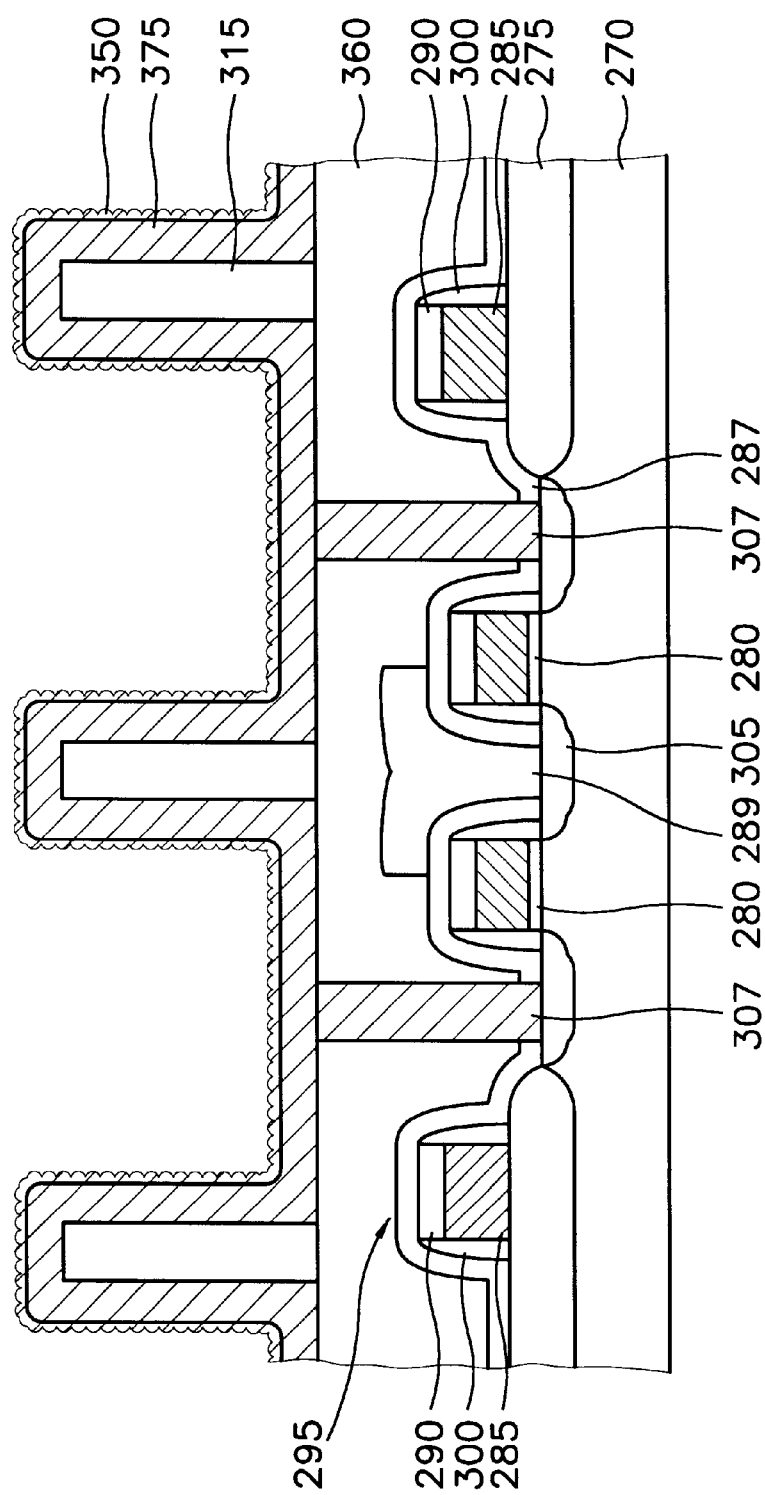

Referring to FIG. 4F, after removing the photoresist pattern 320a, a continuous layer of second conductive layer 375 having a thickness 500 Å is formed on the surfaces of the contact 370 and the sidewalls of second insulating interlayer 360 exposed by the hole 325 and on the whole surface of the sacrificial layer 315, by utilizing a low pressure chemical vapor deposition method. As a result, each cell is formed with a well or a groove covered with a second conductive layer 375 comprising polysilicon. Here, the second conductive layer 375 has prominences and depressions.

Thereafter, an HSG silicon layer 350 having a thickness of about 300–500 Å is formed on the surface of second conductive layer 375 covering the sacrificial layer 315, i.e., the inner surface (including the sidewall surface and bottom surface) of the well of the second conductive layer 375, under a high vacuum or under a pressure of less than 10–7 torr by a reduced pressure chemical vapor deposition method at a temperature of about 400–600㎨ by utilizing $Si_2H_6$ as a reaction gas.

Figure 4G:
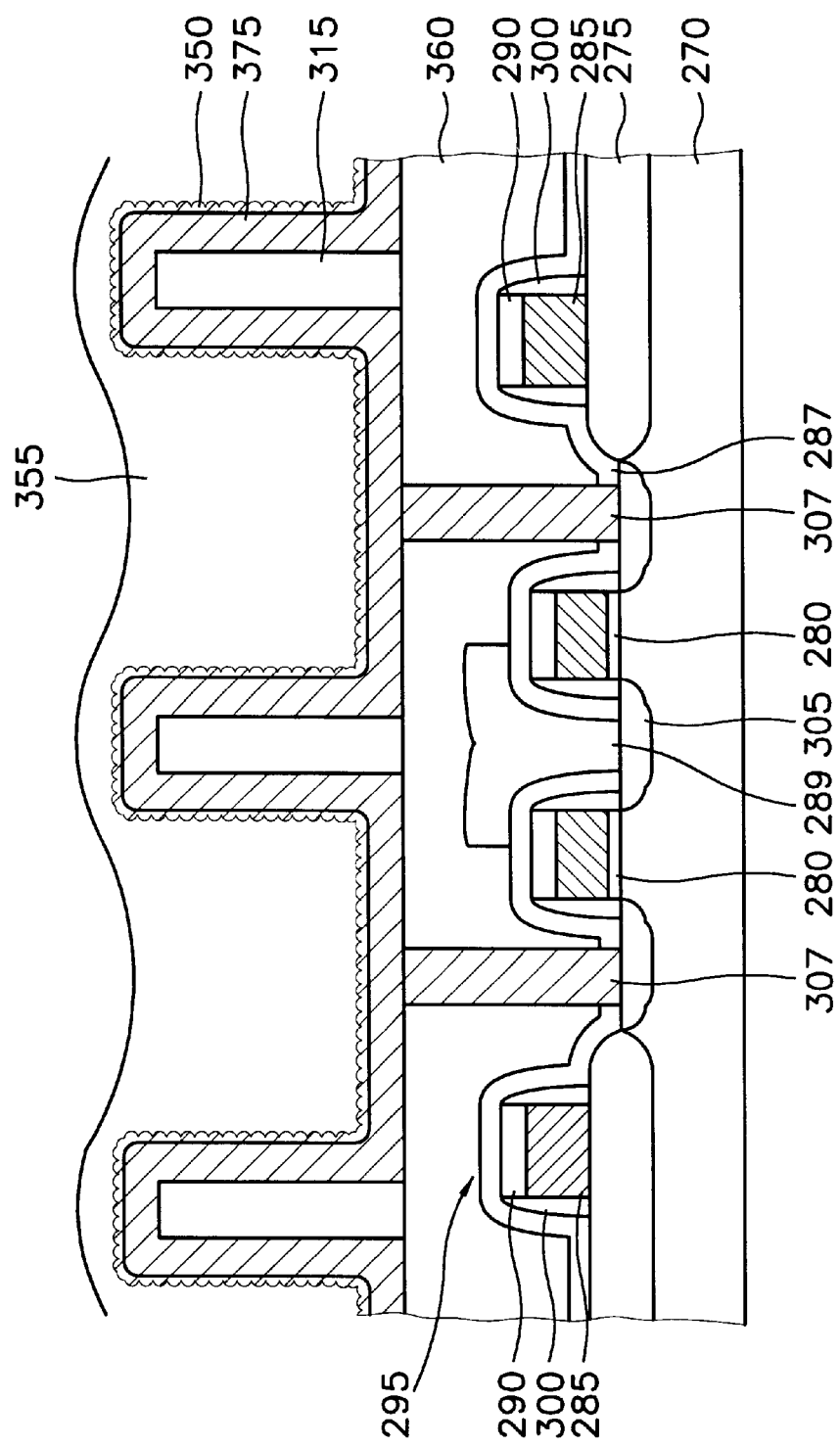
Figure 41:
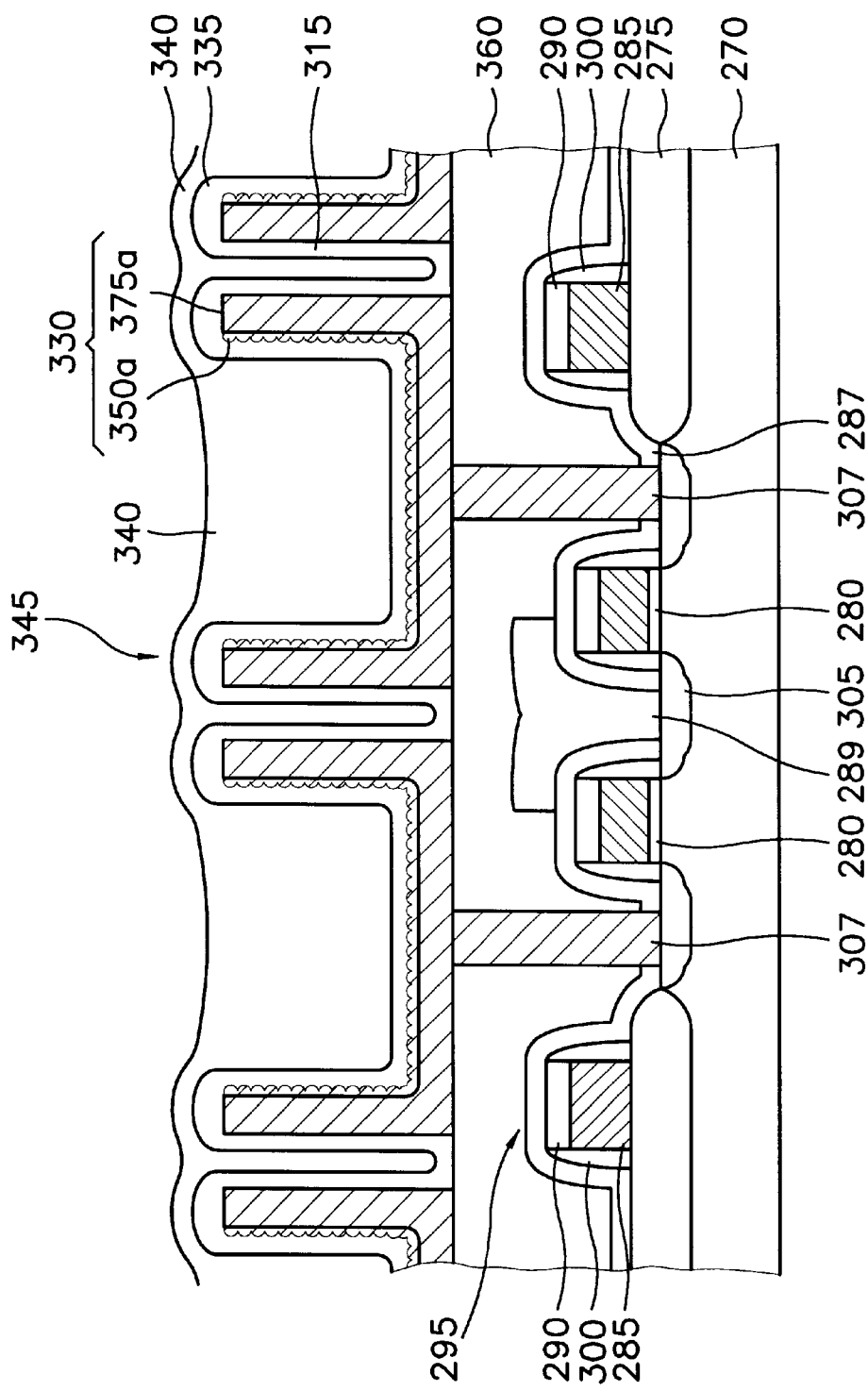

Referring to FIG. 4G, on the second conductive layer 375 now being covered with HSG silicon layer 350, a protective layer 355 is formed by a reduced pressure chemical deposition method utilizing undoped silicate glass having silicon oxide as its main constituent. The protective layer 355 which completely fills the well (or groove) as recessed portions defined by the second conductive layer 375 is formed evenly, and serves to protect the HSG silicon layer 350 formed on the second conductive layer 375 during the subsequent etching process of forming storage electrodes.

Referring to FIG. 4H, the protective layer 355, the second conductive layer 375, and the HSG silicon layer 350 are simultaneously subjected to an etch-back process. Here, the etch-back process is carried out by TCP-polysilicon etching equipment under a pressure of about 5–20 mTorr, preferably about 10 mTorr. By maintaining the power at 600 TCP watts and the bias power at 200 watts, carbon tetrafluoride gas is introduced at a flow rate of about 180 sccm (standard cubic centimeter per minute) while nitrogen gas is introduced at a flow rate of about 5 sccm. Consequently, as shown by Table 1, silicon oxide is etched at a rate of about 2602 Å/min and polysilicon is etched at rate of about 2709 Å/min to achieve a polysilicon/silicon oxide etching selectivity ratio of 1.04, which is very close to the ideal value of 1.

As a result of the above etch-back process, the protective layer 355 is etched to leave behind a protective layer residue 355a, while a storage electrode 330 having a cylindrical shape and comprising a second conductive layer pattern 375a and an HSG silicon layer pattern 350a is formed by the etching of the HSG silicon layer 350 and the second conductive layer 375 sequentially formed on top of the sacrificial layer 315. Because the protective layer 355, the sacrificial layer 350, and the second conductive layer 375 are simultaneously etched by the same gas etchant composition of the present invention as described above, the respective heights of the protective layer residue 355a, the sacrificial layer 315, the second conductive pattern 375a, and the HSG silicon layer pattern 350a, are substantially similar to render a leveled surface.

Referring to FIG. 4I, by utilizing a buffered oxide etchant (BOE) to completely remove all silicon oxide remaining on the semiconductor substrate 270, the sacrificial layer 315 and the protective layer residue 355a remaining in the well of the storage electrode 330 are removed by wet-etching process. Then, on the surface of the storage electrode 330, a dielectric film 335 and subsequently a plate electrode 340 are formed to obtain a capacitor 345. Thereafter, a DRAM device is formed with a transistor and the capacitor 345 by the conventional semiconductor device manufacturing processes.

According to the above described method for manufacturing a semiconductor device, the protective layer and the second conductive layer comprising polysilicon and covered with the HSG silicon layer are simultaneously etched-back by utilizing the same etching equipment and the gas etchant composition of the present invention. During the etch-back process, because both the protective layer and the second conductive layer are etched simultaneously at substantially similar etching rates by the gas etchant composition having a polysilicon/silicon oxide selectivity ratio close to the value of 1, an even surface having a good profile is obtained, as show by FIG. 4H. As a result, the detachments of polysilicon particles formed on the second conductive layer can be markedly reduced so as to prevent the formation of a silicon bridge.

Further, in the present invention, because the protective layer comprising silicon oxide and the second conductive layer comprising polysilicon are simultaneously etched-back in a single process utilizing the same etching equipment, the separate processes of etching-back the respective protective layer and the second conductive layer in separate etching equipment with different gas etchants, which is required in the conventional methods, can be eliminated. Hence, the efficiency of the manufacturing process can be enhanced to increase the manufacturing output.

FIGS. 5A to 5F are sectional views illustrating an additional photolithography process for processing an edge portion of the semiconductor substrate (wafer) illustrated in FIGS. 4D to 4I.

Figure 5A:
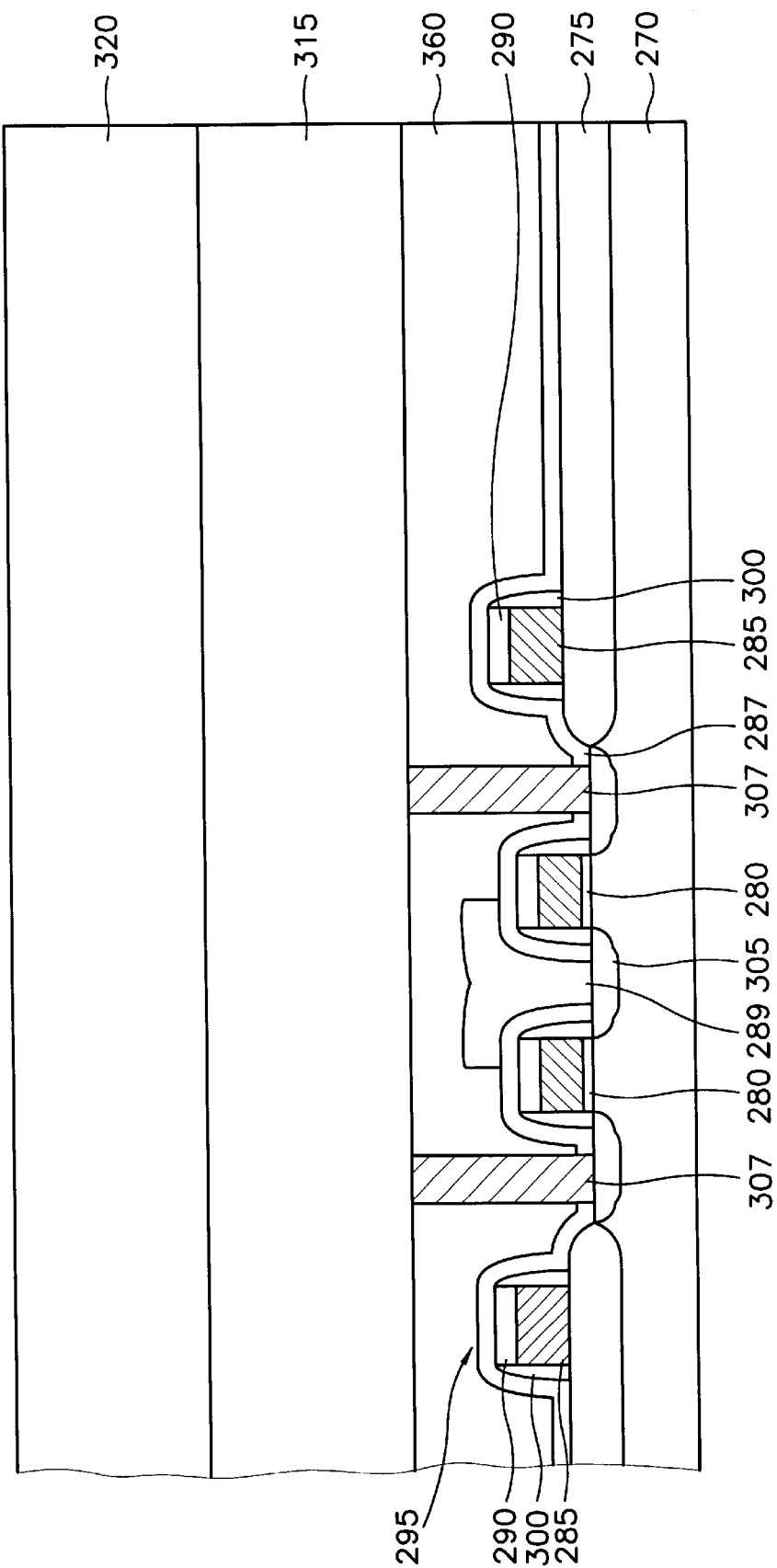
FIGS. 5A to 5G are sectional views illustrating an additional photolithography process for processing an edge portion of a semiconductor substrate illustrated in FIGS. 4D to 4I.

Referring to FIG. 5A and as shown by FIG. 4D, after forming the sacrificial layer 315 comprising silicon oxide material, a photoresist film 320 is formed on the surface of the sacrificial layer 315.

Figure 5B:
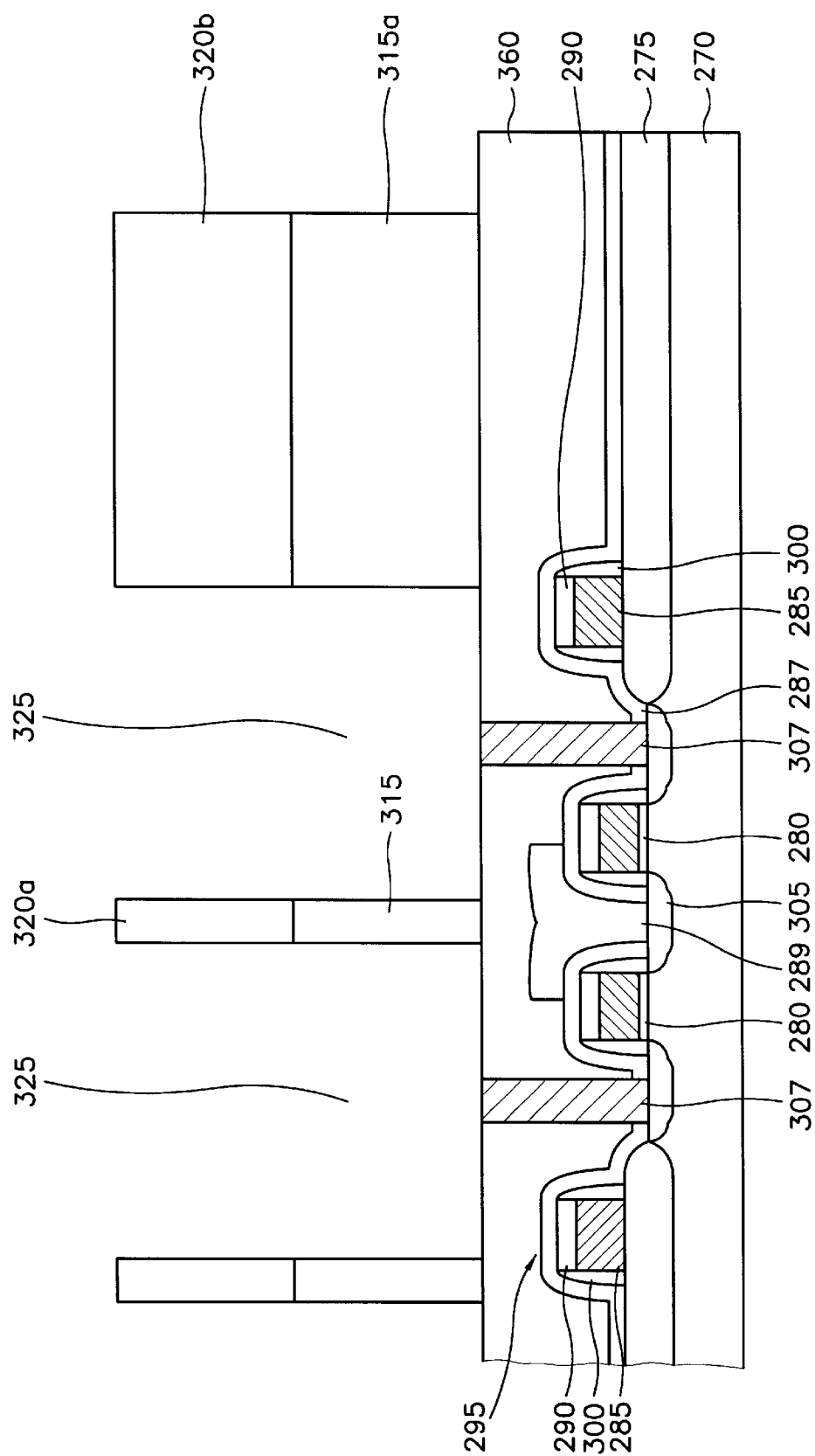

Referring to FIG. 5B, the photoresist film 320 is subjected to a conventional photo-process to form photoresist patterns 320a and 320b for forming a hole in each unit cell. Here, the photoresist pattern 320b is formed to mainly occupy the edge portion of the semiconductor substrate and is differentiated from the photoresist pattern 320a formed on the region of the cells by having a larger size. Then, by utilizing the photoresist patterns 320a and 320b as an etching mask, the sacrificial layer 315 is etched to form a number of holes 325 to be utilized for eventually forming a capacitor. Here, by the photoresist pattern 320b occupying the edge portion, a sacrificial layer pattern 315a is formed on the edge portion of the semiconductor substrate. The sacrificial layer pattern 315a is larger in size than the sacrificial layer 315 formed on the central region.

Figure 5C:
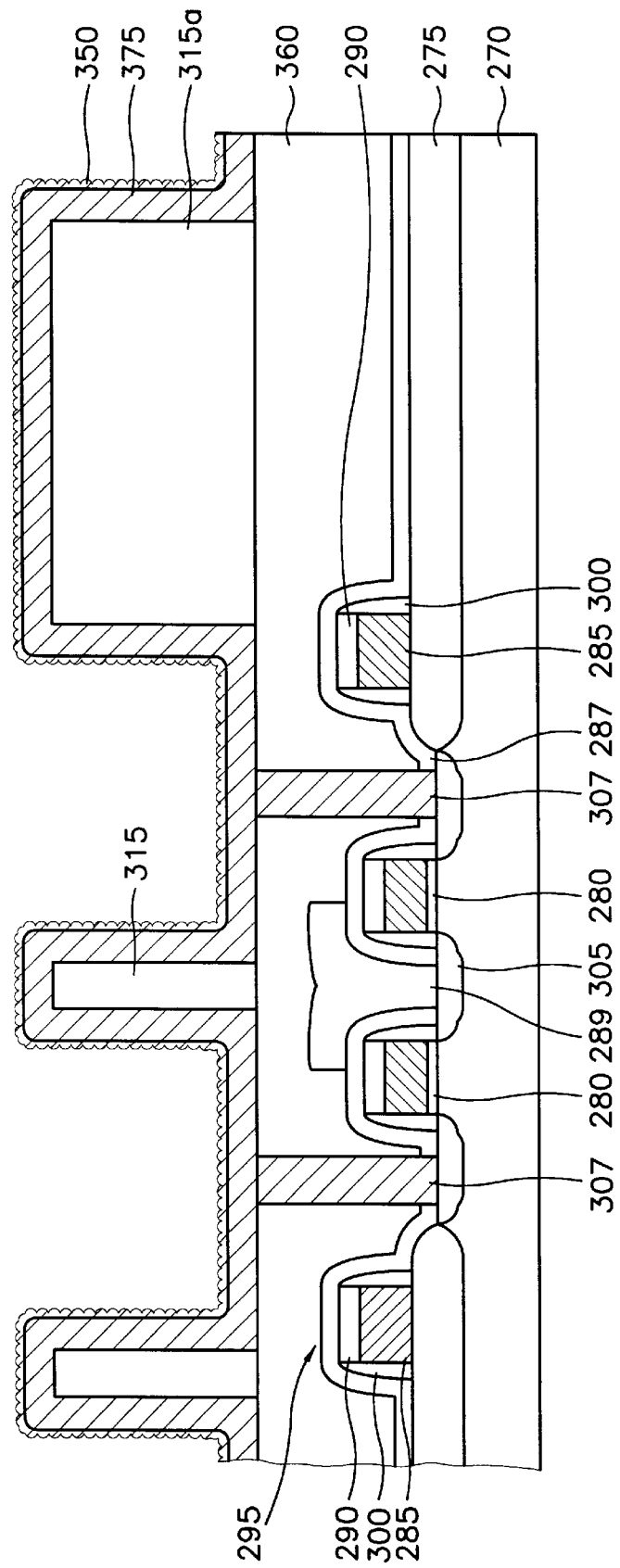

Referring to FIG. 5C, after removing the photoresist patterns 320a and 320b by utilizing a stripping or ashing process, a second insulating interlayer 375 is formed on the common surface of the contact 370 and the second insulating interlayer 360 and on the whole surface of the sacrificial layer 315. Here, the second conductive layer 375 is also formed on the edge portion of the substrate and on the sacrificial layer pattern 315a located near the edge of the substrate. Then, an HSG silicon layer 350 is formed on the surface of the second conductive layer 375.

Figure 5D:
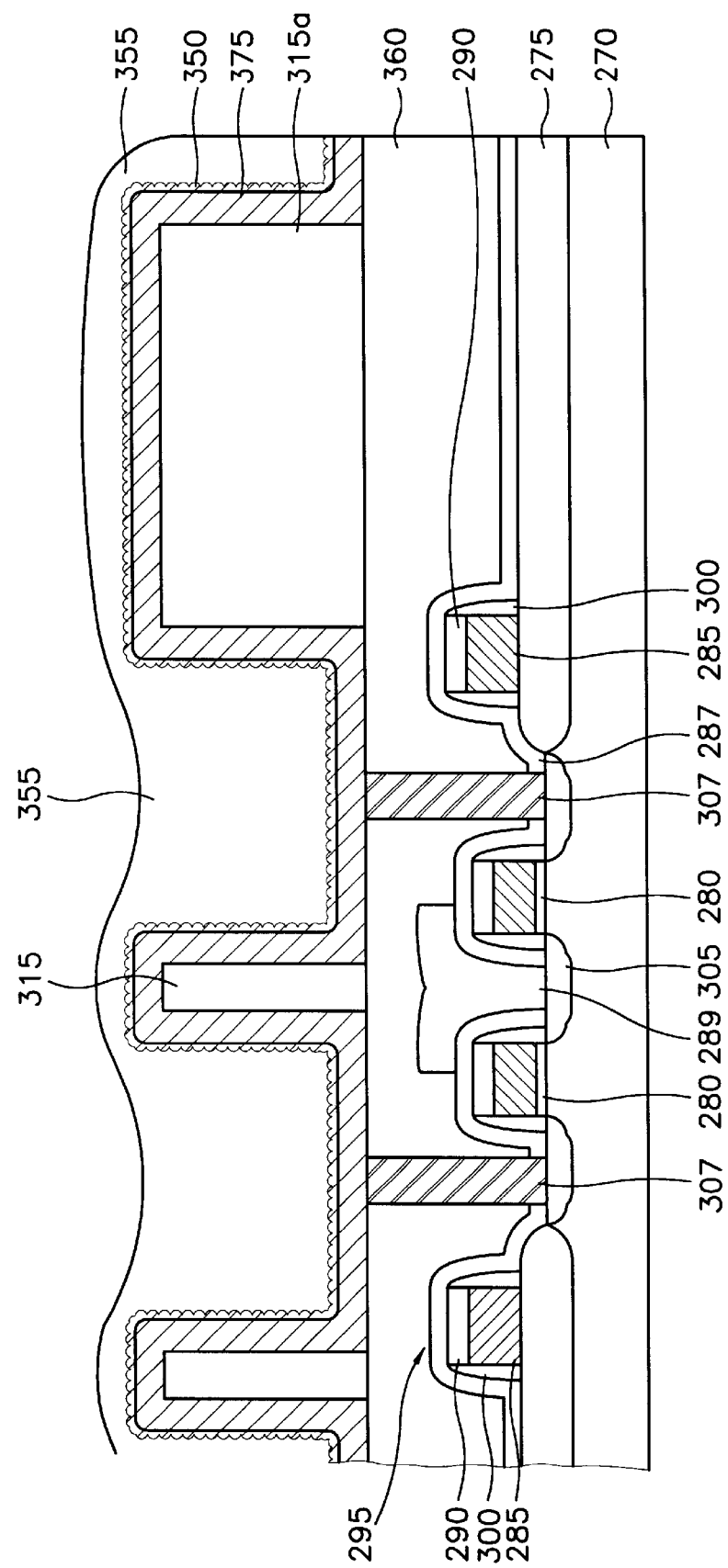

Referring to FIG. 5D, a protective layer 355 is formed from USG (undoped silicate glass) on the surface of the HSG silicon layer 350. The protective layer 355 comprises silicon oxide material, and is formed utilizing a low pressure chemical vapor deposition method.

Figure 5E:
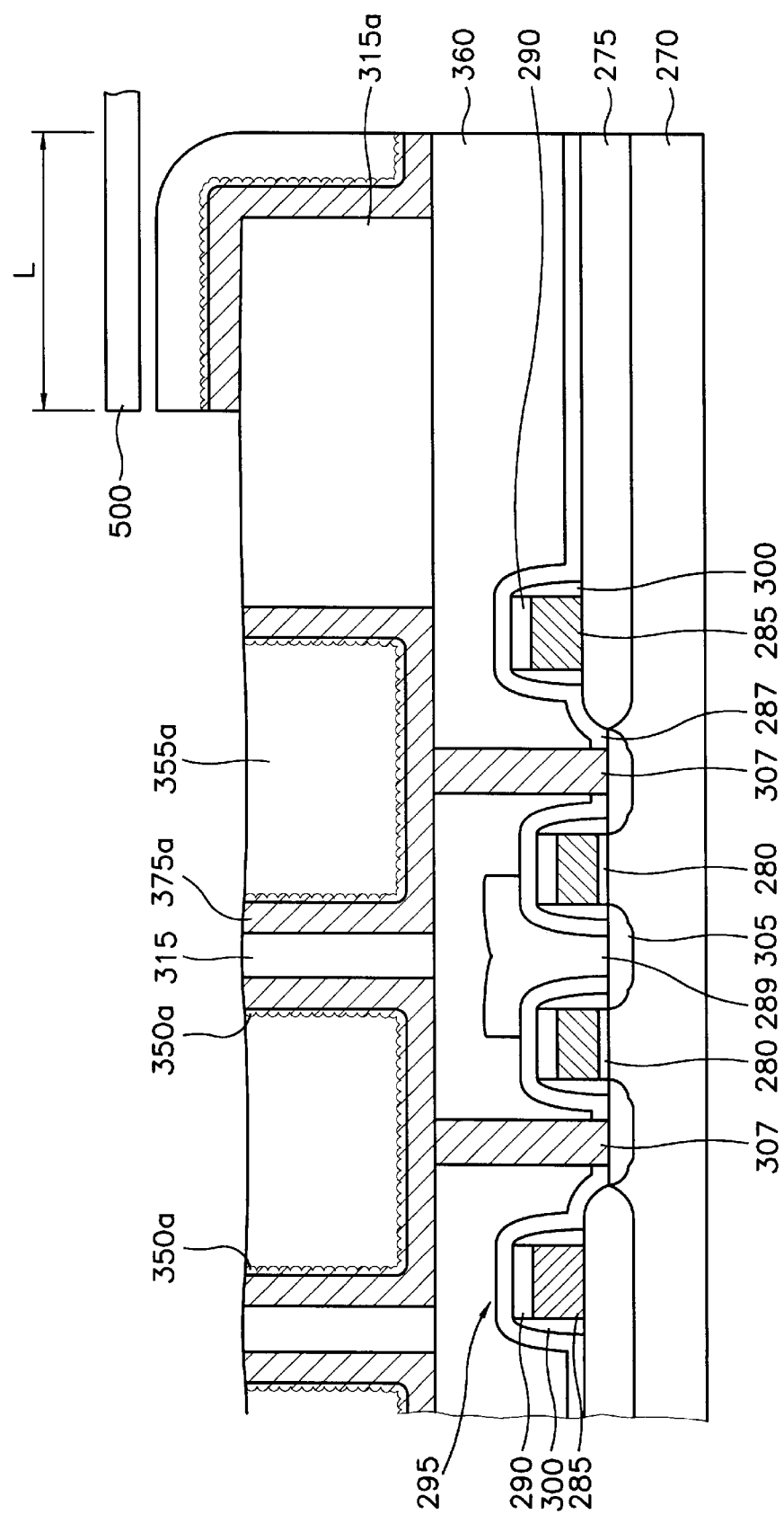

Referring to FIG. 5E, the protective layer 355, the second conductive layer 375, and the HSG silicon layer 350 are simultaneously subjected to an etch-back process. As a result of the etch-back process, the protective layer 355 is etched to leave behind a protective layer residue 355a, while a storage electrode 330 having a cylindrical shape and comprising a second conductive layer pattern 375a and an HSG silicon layer pattern 350a is formed by the etching of the HSG silicon layer 350 and the second conductive layer 375 formed on the top of the sacrificial layer 315. The surface of the edge of the substrate is physically covered by a clamp 500, or the surface of the edge is physically masked. The clamp is utilized to prevent the peripheral portion and the edge of the substrate from being exposed to the dry gas etchant during the etch-back process. The portion of the substrate covered by the clamp, indicated by L, is about 2 mm from the edge of the substrate. Generally, the clamp utilized is made from aluminum or the like metals and has a ring shape having a flat lower zone completely surrounding the edge of the substrate and the portion near to the edge.

Figure 5F:
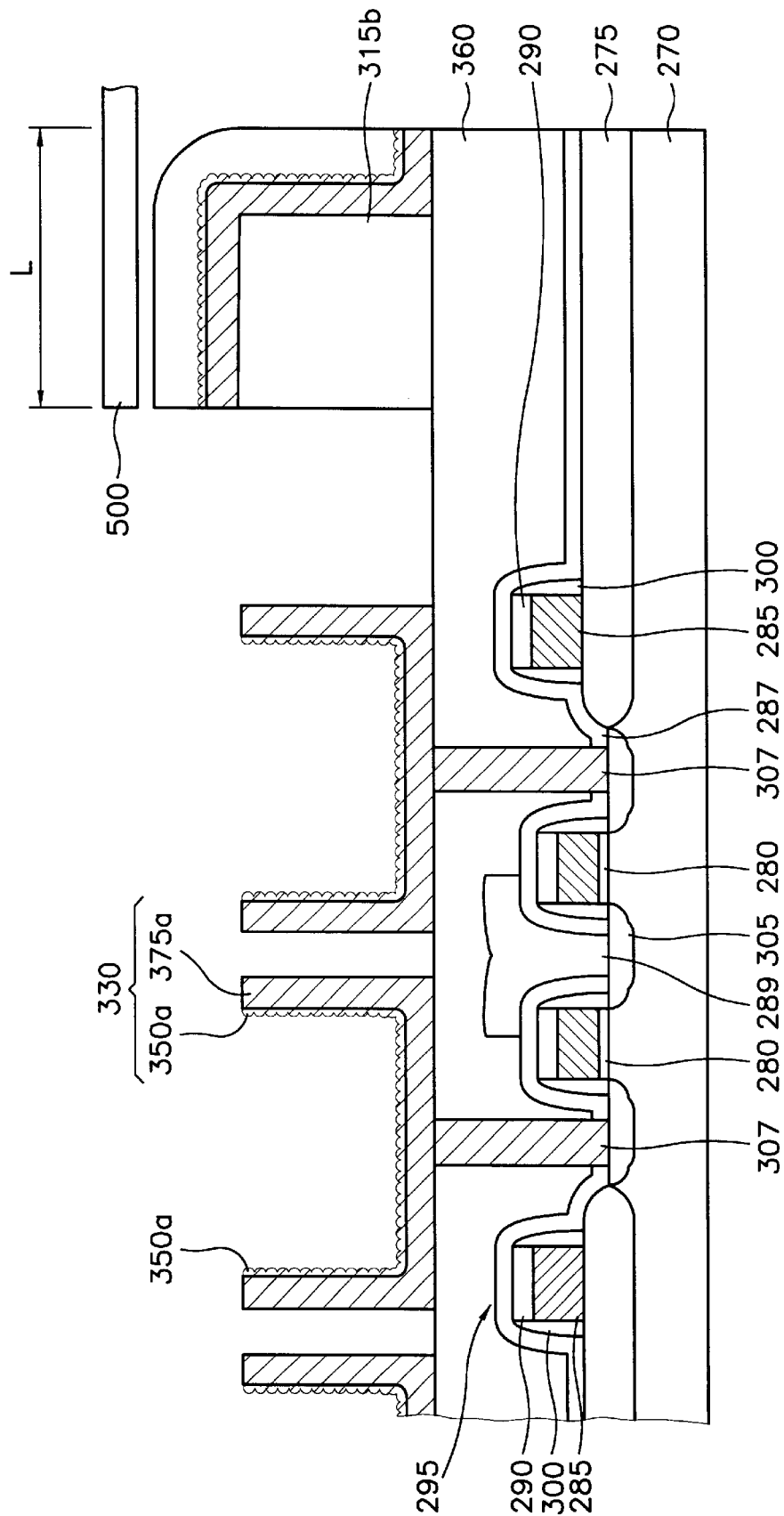

Referring to FIG. 5F, a buffered oxide etchant (BOE) is used to completely remove all silicon oxide remaining on the semiconductor substrate 270, such that the sacrificial layer 315 and the protective layer residue 355a remaining in the well of the storage electrode 330 are removed by wet-etching process. Here, a portion of the sacrificial layer pattern 315a located close to the edge of the substrate not etched by the etching process remains as a sacrificial layer residue 315b. Although the wet-etching process exhibits isotropic etching characteristics, the remaining sacrificial layer residue 315b remains after the wet-etching process because the horizontal length of the sacrificial pattern 315a is much longer than its thickness.

Figure 5G:
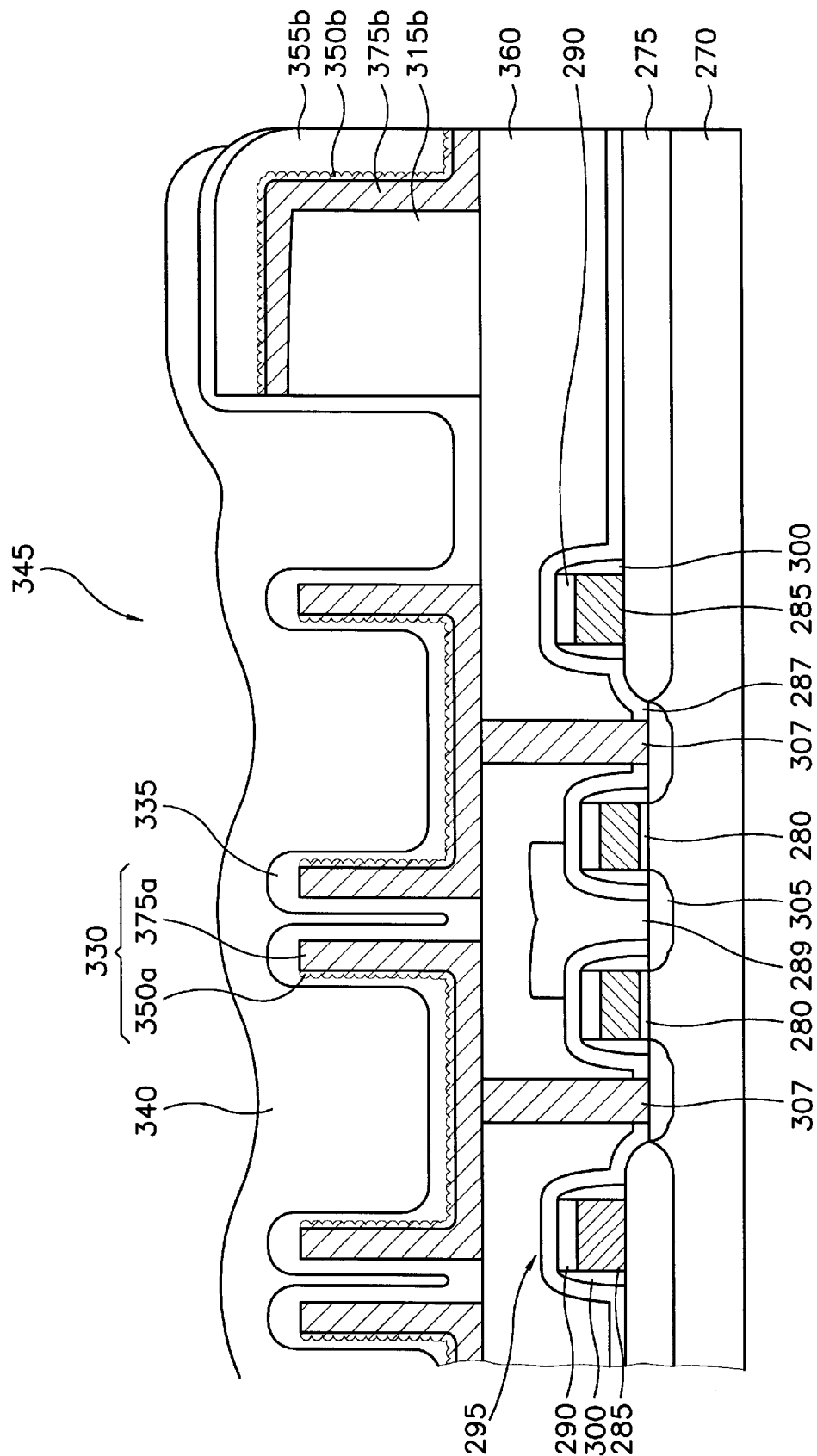

Thereafter, referring to FIG. 5G, after removing the clamp 500, a dielectric film 335 and subsequently a plate electrode 340 are formed on the surface of the storage electrode 330 to obtain a resulting capacitor 345. The second conductive layer 375b and the HSG layer 350b, both comprising polysilicon and formed on the edge of the semiconductor substrate, are now isolated through their upper, side, and lower portions by being insulated with the protective residue 355b, the dielectric film 335, and the sacrificial layer residue 315a, respectively. As a result of this isolation, the formation of a polysilicon bridge caused by detachments of polysilicon particles can be prevented.

In the present invention, a dry gas etchant composition comprising carbon tetrafluoride gas and nitrogen gas is provided. When the gases are mixed in an appropriate ratio, the dry etchant composition of the present invention can be utilized to simultaneously etch both polysilicon and silicon oxide layers at substantially similar etching rates during an etch-back process. Accordingly, a composite layer comprising polysilicon and silicon oxide layers formed on highly integrated semiconductor devices can be effectively removed. Further, due to the simultaneous etching of the polysilicon and silicon oxide layers, a resulting surface having a good profile can be obtained, allowing the subsequent manufacturing processes following the removal of the composite layer to be carried out even more efficiently.

In particular, during the process of manufacturing a capacitor for semiconductor devices, when a dry etchant composition of the present invention is utilized to etch-back both a conductive layer comprising polysilicon and a composite layer comprising silicon oxide layers of an oxide material, a polysilicon pattern having a good surface profile to be utilized for forming a storage electrode can be obtained. Realization of such a profile prevents the formation of polysilicon bridges caused by the detachments of polysilicon particles in the subsequent processes. Specifically, in the manufacturing process utilizing HSG silicon for increasing the effective area of a storage electrode, the detachments of HSG polysilicon particles formed on the surface of the storage electrode pattern can be markedly reduced.

Further, the conventional method of separately etching-back the protective layer and the conductive layer by separate etching equipment with different gas etchants can now be carried out in a single-step process by a single etching equipment utilizing the gas etchant composition of the present invention. Hence, the efficiency of the manufacturing process and consequently the manufacturing output can be increased.

According to a method for manufacturing a semiconductor device provided by the present invention, by utilizing a clamp to physically cover the edge of the semiconductor substrate during the etch-back process of etching the conductive and protective layers, a separate process of removing the protective layer formed on the edge of the substrate for eventually removing the polysilicon formed on the same location, as required in the conventional methods, is no longer necessary. As a result, the conventionally accompanied photoresist coating process, light exposure process, and development process and the etching process of removing the protective layer can be eliminated, thus enhancing the manufacturing output of semiconductor devices.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A dry etching gas etchant composition comprising carbon tetrafluoride gas and nitrogen gas for simultaneously etching both polysilicon and silicon oxide during an etch-back process, wherein a mixed ratio by volume of carbon tetrafluoride gas and nitrogen gas is 25–40:1.

2. The dry etching gas etchant composition as claimed in claim 1, wherein an etching rate ratio of polysilicon to silicon oxide is 0.8–1.2:1.

3. An etching method for etching polysilicon and oxide materials, wherein both polysilicon and silicon oxide formed on a substrate are etched simultaneously by utilizing a common gas etchant composition, and wherein an etching rate ratio of polysilicon to silicon oxide is 0.8–1.2:1.

4. An etching method for etching polysilicon and oxide materials, wherein both polysilicon and silicon oxide formed on a substrate are etched simultaneously by utilizing a common gas etchant composition, and wherein a mixed gas etchant comprising carbon tetrafluoride gas and nitrogen gas is utilized at a pressure of 5–20 mTorr.

5. The etching method for etching polysilicon and oxide materials as claimed in claim 4, wherein a mixing ratio of carbon tetrafluoride gas and nitrogen gas is 25–40:1.

6. An etching method for etching polysilicon and oxide materials, wherein both polysilicon and silicon oxide formed on a substrate are etched simultaneously by utilizing a common gas etchant composition, and wherein the polysilicon has a structure of an HSG polysilicon layer on top of a layer of repeating-teeth-like prominences and depressions.

7. The etching method for etching polysilicon and oxide materials as claimed in claim 6, wherein silicon oxide fills the depressions in the layer of repeating-teeth-like prominences and depressions to obtain a planarized surface.

8. A method for manufacturing a capacitor comprising steps of:
   forming an insulating layer on a semiconductor substrate, wherein the insulating layer has an opening to be defined as a cell unit;
   forming a first conductive layer on a surface of the insulating layer, on an inner-surface of the opening, and on a surface of an underlying layer exposed by the opening such that a well is formed, the first conductive layer having a continuing structure of polysilicon;
   forming a protective layer comprising silicon oxide for filling the well of the first conductive layer;
   forming a first conductive pattern defined with a cell unit by simultaneously etching-back the protective layer and the first conductive layer until an upper portion of the insulating layer is exposed;
   removing the insulating layer and residues from the protective layer after the etch-back process; and
   forming a dielectric film and a second conductive layer on the first conductive layer to form a capacitor.

9. The method for manufacturing a capacitor as claimed in claim 8, wherein the first conductive layer and the protective layer are etched by a mixed gas etchant comprising carbon tetrafluoride gas and nitrogen gas at a pressure of 5–20 mTorr.

10. The method for manufacturing a capacitor as claimed in claim 9, wherein a mix ratio of carbon tetrafluoride gas and nitrogen gas is 25–40:1.

11. The method for manufacturing a capacitor as claimed in claim 8, further comprising a step of forming an HSG polysilicon layer on a surface of the first conductive layer.

12. The method for manufacturing a capacitor as claimed in claim 8, further comprising a step of physically covering an edge of the semiconductor substrate to protect the first conductive layer and the protective layer formed on the edge from the gas etchant during the etch-back process.

13. The method for manufacturing a capacitor as claimed in claim 12, wherein the step of physically covering the edge of the semiconductor substrate is accomplished using a clamp.

14. A method for manufacturing a capacitor comprising steps of:
   forming an insulating layer on a semiconductor substrate, wherein the insulating layer has an opening to be defined as a cell unit;
   forming a first conductive layer on a surface of the insulating layer, on an inner-surface of the opening, and on a surface of an underlying layer exposed by the opening such that a well is formed, the first conductive layer having a continuing structure of polysilicon;
   forming a protective layer comprising silicon oxide for filling the well in the first conductive layer;
   forming a first conductive pattern defined with a cell unit by etching-back the protective layer and the first conductive layer until an upper portion of the insulating layer is exposed, while physically covering an edge of the semiconductor substrate;
   removing the insulating layer and residues from the protective layer after the etch-back process; and
   forming a dielectric film and a second conductive layer on the first conductive layer to form a capacitor.

15. The method for manufacturing a capacitor as claimed in claim 14, wherein the first conductive layer and the protective layer are etched simultaneously by a mixed gas etchant composition comprising carbon tetrafluoride gas and nitrogen gas.

16. The method for manufacturing a capacitor as claimed in claim 14, further comprising a step of forming an HSG polysilicon layer on a surface of the first conductive layer.

* * * * *